United States Patent
Wang et al.

(10) Patent No.: US 11,309,031 B2
(45) Date of Patent: Apr. 19, 2022

(54) PERIODIC REDUCED WORD LINE BIAS WHICH INCREASES CHANNEL BOOSTING

(71) Applicant: Western Digital Technologies, Inc., San Jose, CA (US)

(72) Inventors: Ming Wang, Shanghai (CN); Liang Li, Shanghai (CN); Peng Zhang, San Jose, CA (US); Yanli Zhang, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 115 days.

(21) Appl. No.: 17/008,926

(22) Filed: Sep. 1, 2020

(65) Prior Publication Data

US 2022/0068390 A1 Mar. 3, 2022

(30) Foreign Application Priority Data

Aug. 28, 2020 (CN) .......................... 202010883853.X

(51) Int. Cl.
*G11C 16/04* (2006.01)
*G11C 16/08* (2006.01)
*G11C 16/26* (2006.01)
*G11C 16/16* (2006.01)

(52) U.S. Cl.
CPC .............. *G11C 16/08* (2013.01); *G11C 16/16* (2013.01); *G11C 16/26* (2013.01); *G11C 16/04* (2013.01)

(58) Field of Classification Search
CPC ................... G11C 16/0483; G11C 16/3454
USPC ............................... 365/185.02, 185.2
See application file for complete search history.

(56) References Cited

U.S. PATENT DOCUMENTS

| | | | |
|---|---|---|---|
| 7,355,888 B2 | 4/2008 | Hemink et al. | |
| 7,440,323 B2 | 10/2008 | Lutze et al. | |
| 7,440,326 B2 | 10/2008 | Ito | |
| 7,460,404 B1 | 12/2008 | Dong et al. | |
| 8,625,357 B2 | 1/2014 | Cho et al. | |
| 8,644,075 B2 | 2/2014 | Hemink et al. | |
| 9,966,144 B2 | 5/2018 | Kwon et al. | |
| 10,283,208 B2 | 5/2019 | Costa | |
| 10,381,095 B1 * | 8/2019 | Date | G11C 16/16 |
| 2016/0099058 A1 | 4/2016 | Yuan et al. | |

OTHER PUBLICATIONS

International Search Report & The Written Opinion of the International Searching Authority dated Oct. 26, 2021, International Application No. PCT/US2021/033714.

* cited by examiner

*Primary Examiner* — Jason Lappas
(74) *Attorney, Agent, or Firm* — Vierra Magen Marcus LLP

(57) ABSTRACT

Apparatuses and techniques are described for increasing channel boosting of NAND string during programming by applying a periodic low word line bias during programming. In one aspect, a low pass voltage, VpassL, is applied to designated word lines to create periodic low points or dips in the channel boosting level. A normal pass voltage, Vpass, is applied to other unselected word lines. The low points create barriers to the movement of electrons in the channel toward the selected word line, to prevent the electrons from pulling down the voltage at the channel region which is adjacent to the selected word line. VpassL can be applied to designated word lines at the source and/or drain sides of the selected word line. A control circuit can be configured with various parameters for implementing the techniques.

20 Claims, 26 Drawing Sheets

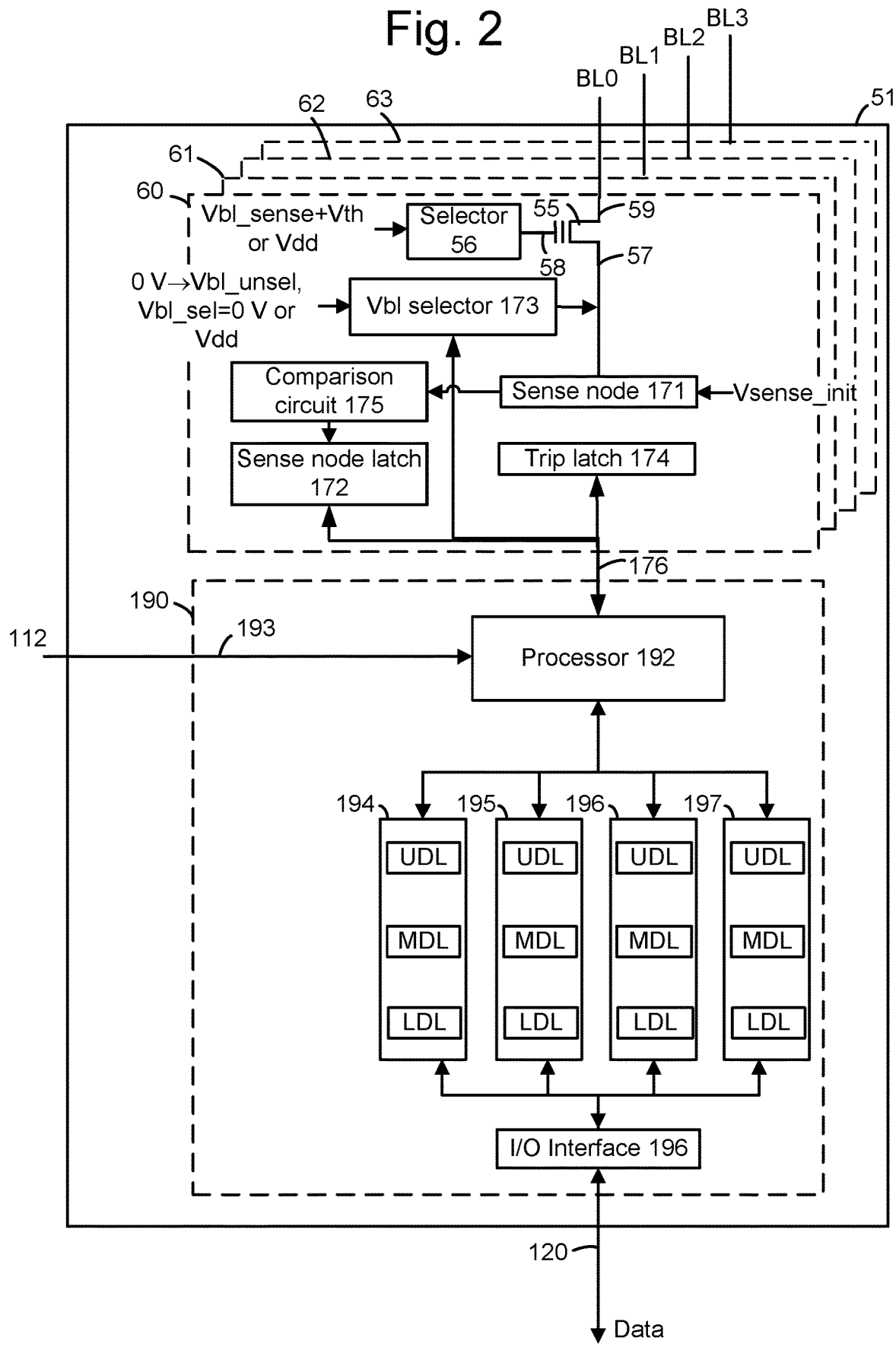

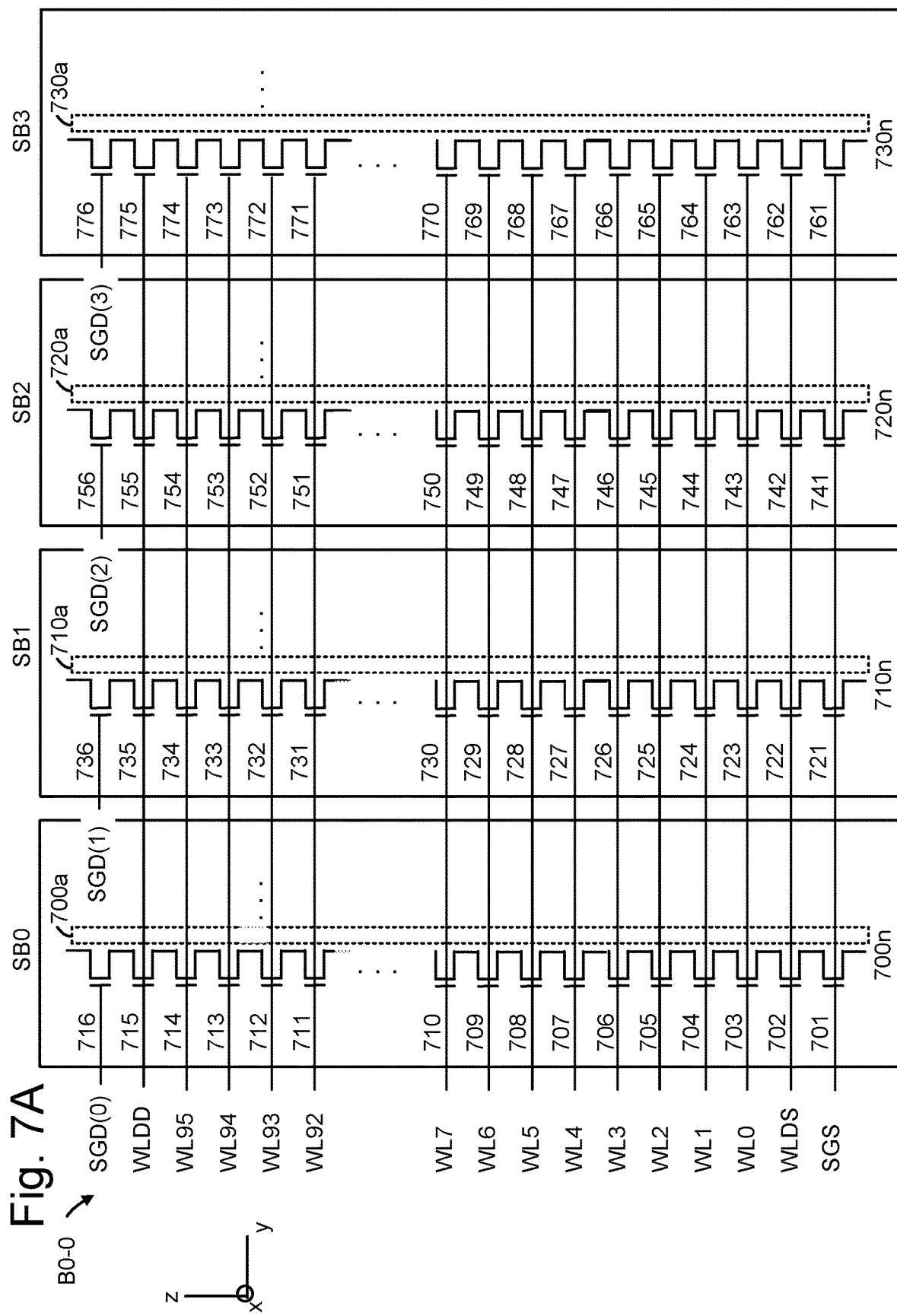

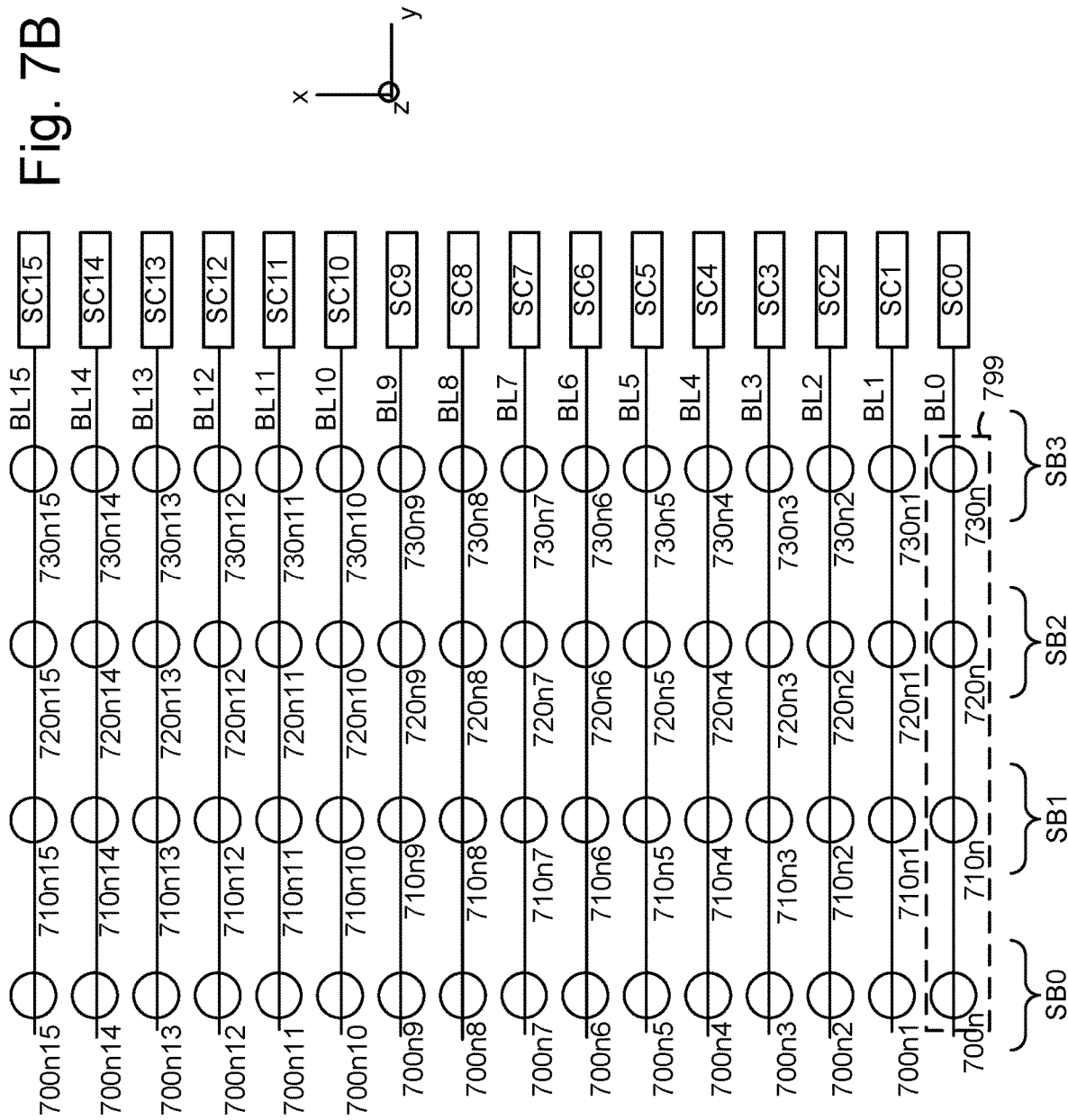

| Mode | SGD | BL |
|---|---|---|
| Program | Vsgd | 0 V |
| x mode | Vsgd | Vddsa |
| y mode | 0 V | 0 V |
| xy mode | 0 V | Vddsa |

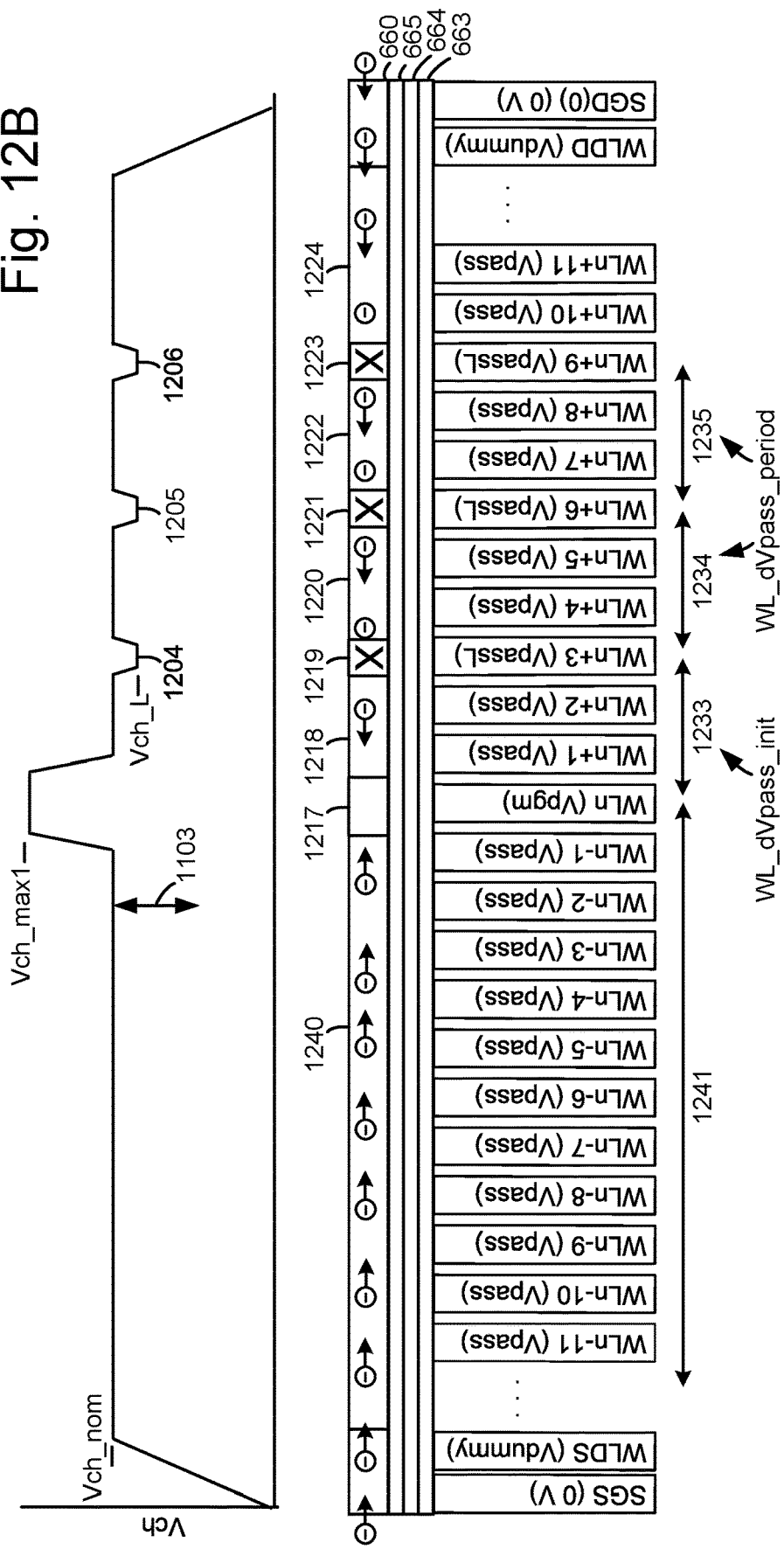

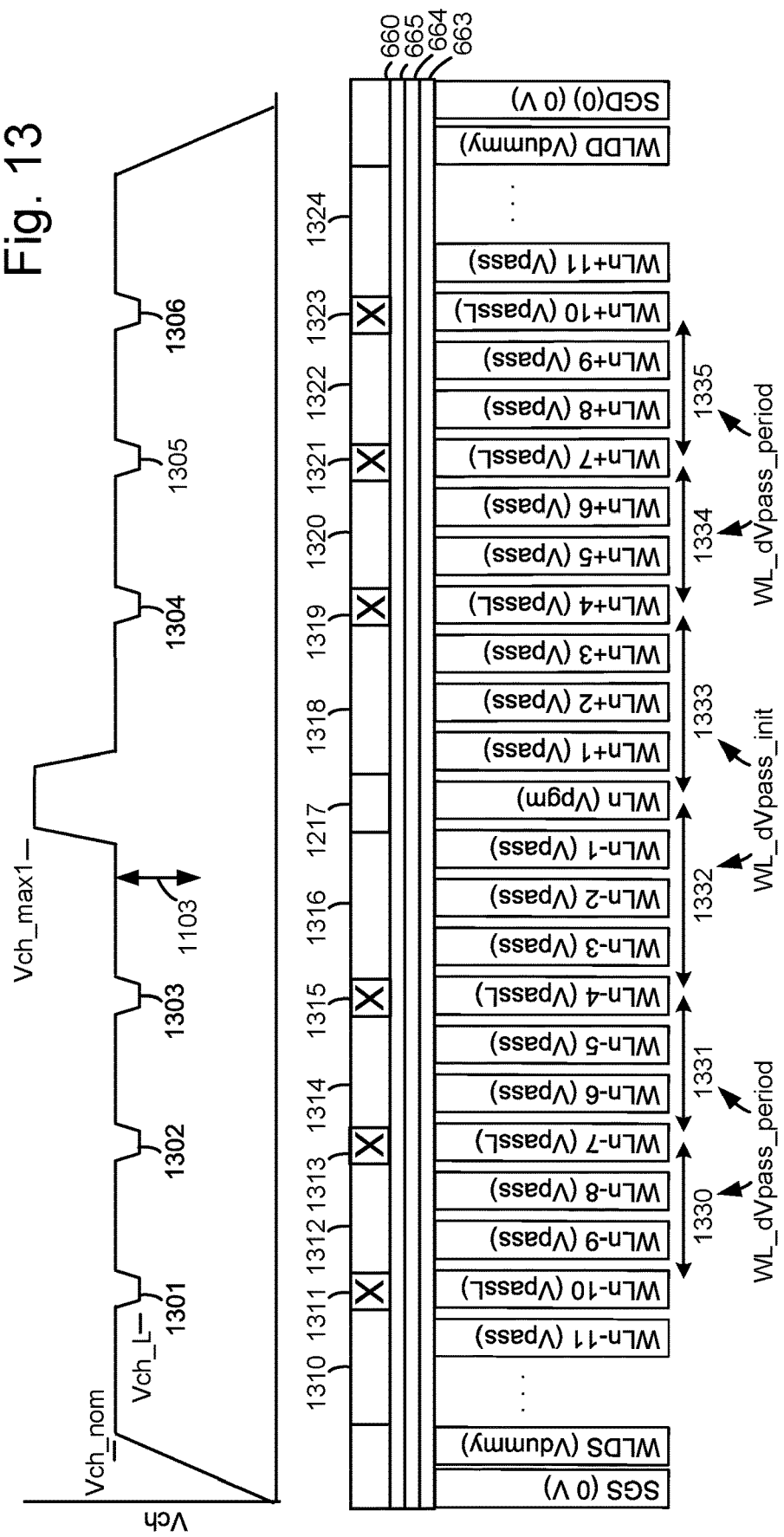

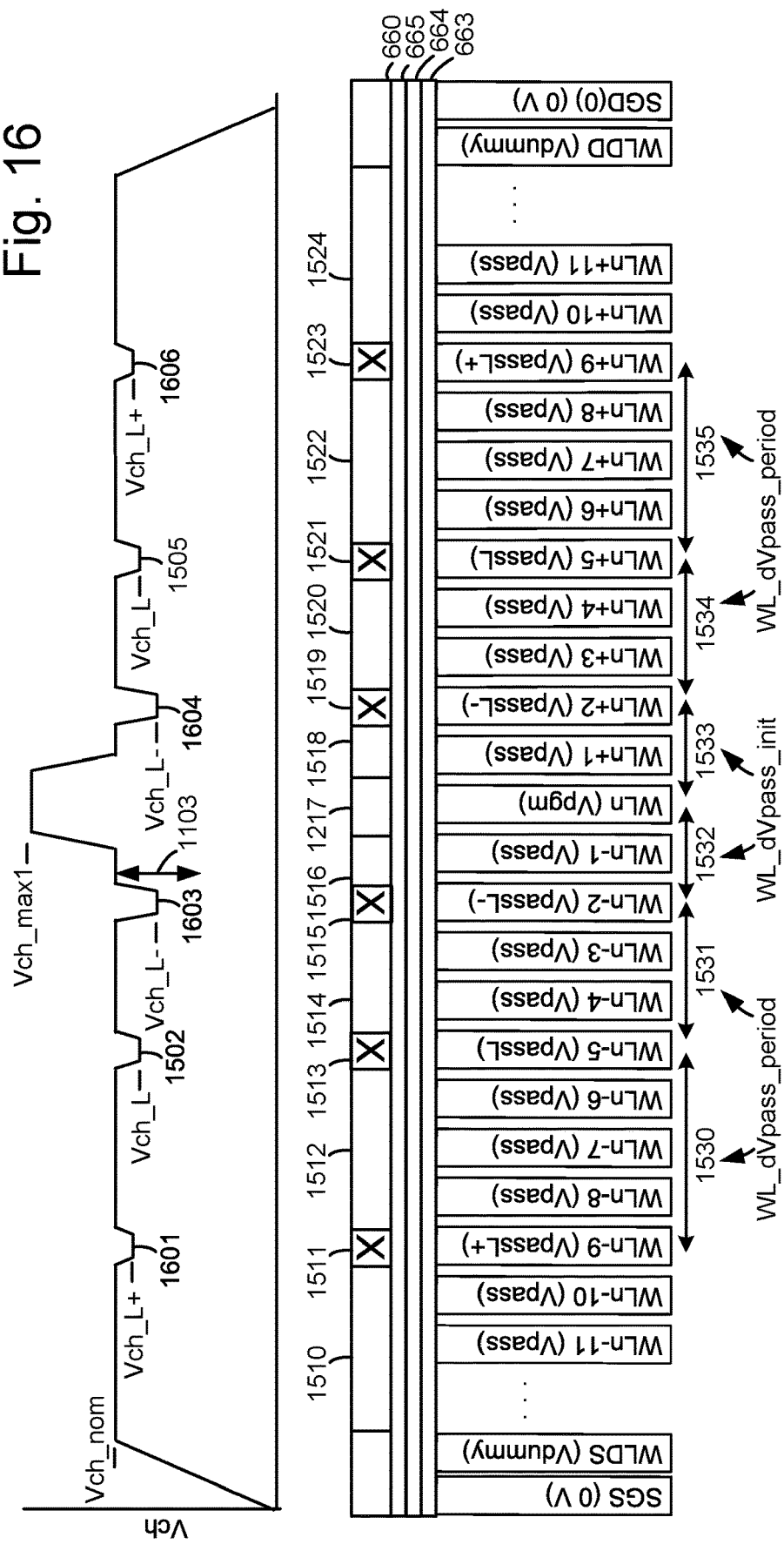

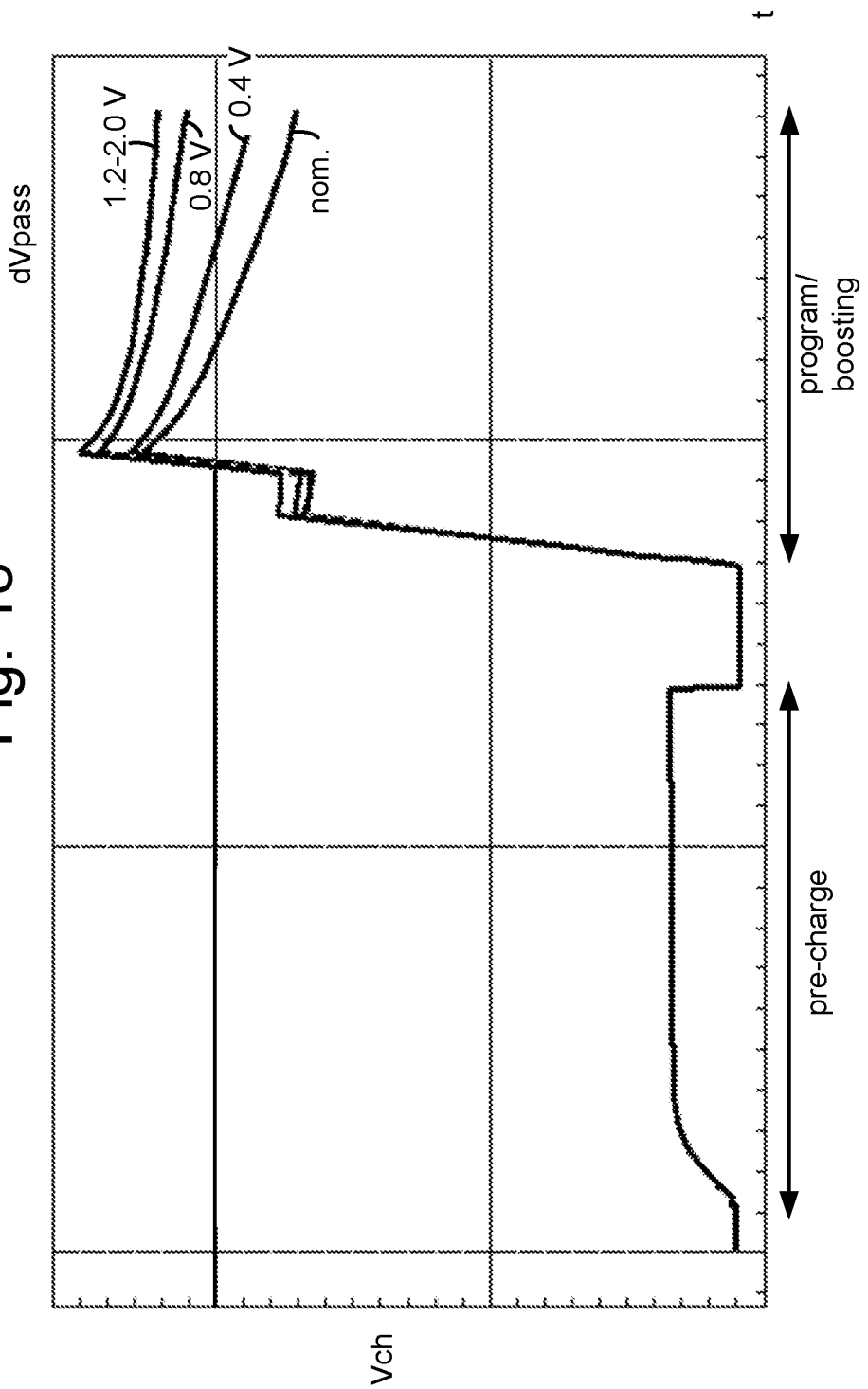

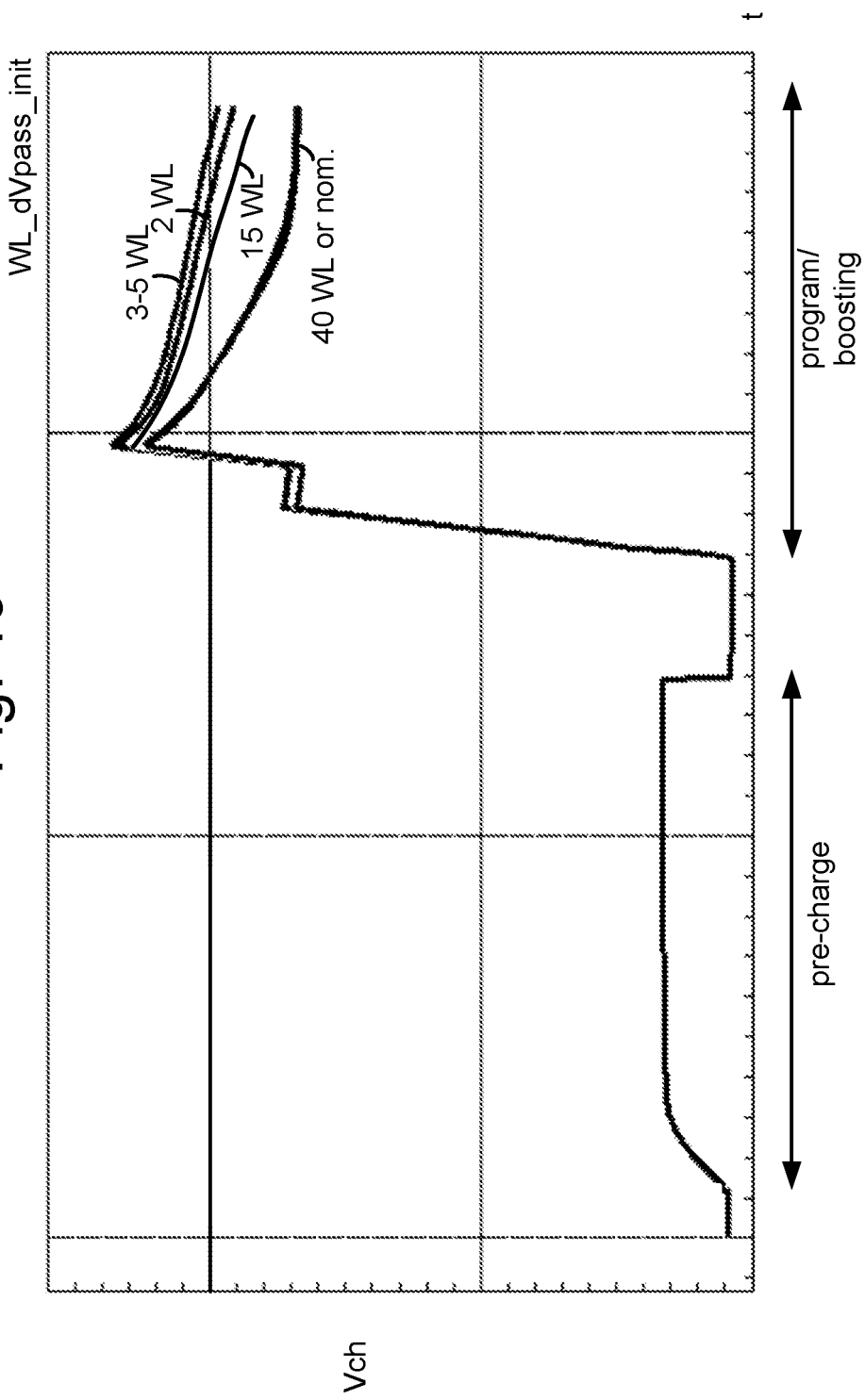

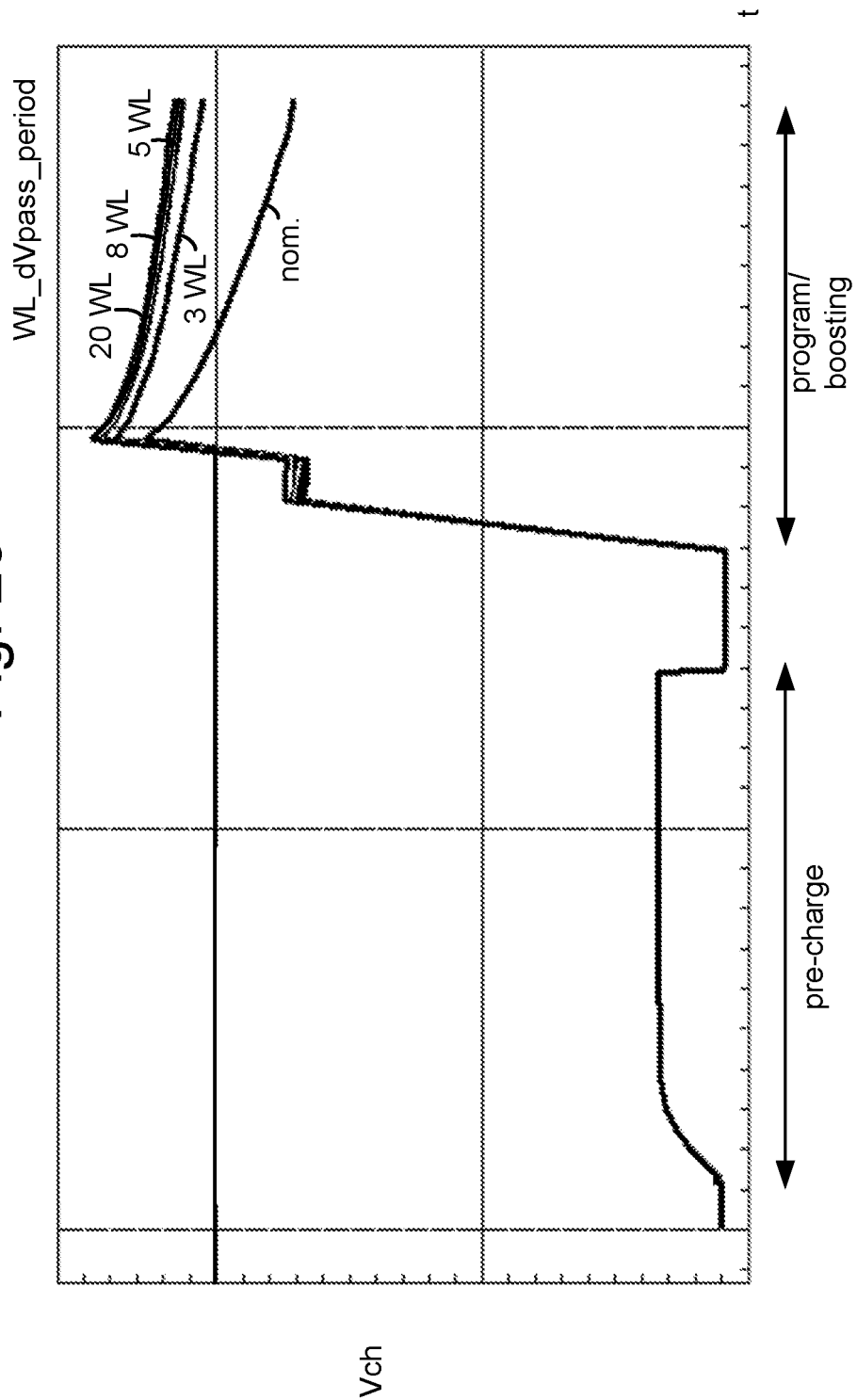

| [2] | [1] | [0] | dVpass (V) |
|---|---|---|---|
| 0 | 0 | 0 | 0.6 |
| 0 | 0 | 1 | 0.8 |
| 0 | 1 | 0 | 1.0 |
| 0 | 1 | 1 | 1.2 |
| 1 | 0 | 0 | 1.4 |
| 1 | 0 | 1 | 1.6 |
| 1 | 1 | 0 | 1.8 |
| 1 | 1 | 1 | 2.0 |

| [2] | [1] | [0] | WL_dVpass_init |
|---|---|---|---|
| 0 | 0 | 0 | 3 |
| 0 | 0 | 1 | 4 |
| 0 | 1 | 0 | 5 |
| 0 | 1 | 1 | 6 |
| 1 | 0 | 0 | 7 |
| 1 | 0 | 1 | 8 |
| 1 | 1 | 0 | 9 |
| 1 | 1 | 1 | 10 |

| [2] | [1] | [0] | WL_dVpass_period |
|---|---|---|---|
| 0 | 0 | 0 | 3 |
| 0 | 0 | 1 | 4 |
| 0 | 1 | 0 | 5 |
| 0 | 1 | 1 | 6 |
| 1 | 0 | 0 | 7 |
| 1 | 0 | 1 | 8 |
| 1 | 1 | 0 | 9 |
| 1 | 1 | 1 | 10 |

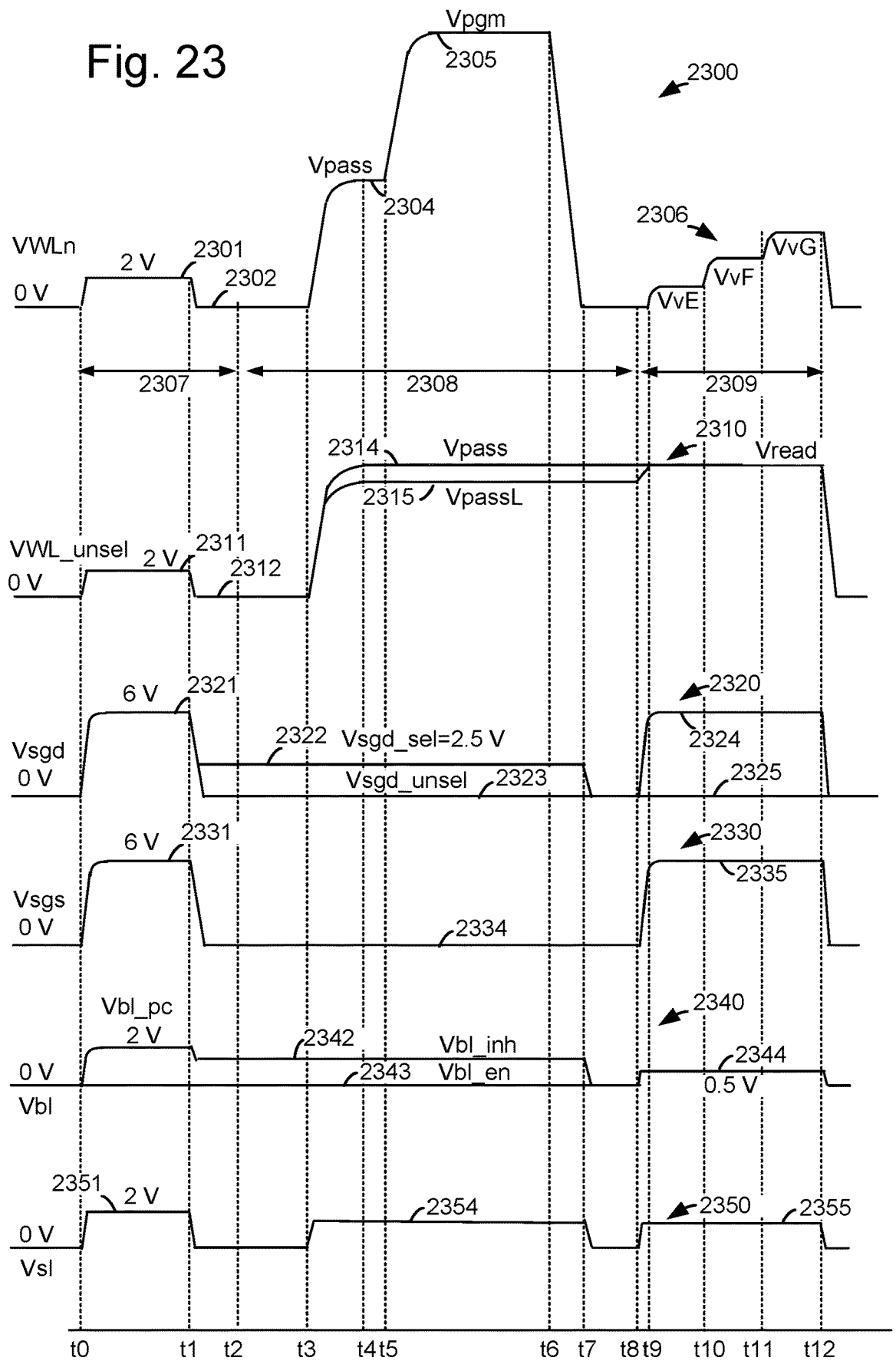

PERIODIC REDUCED WORD LINE BIAS WHICH INCREASES CHANNEL BOOSTING

CLAIM OF PRIORITY

This application claims priority from Chinese Patent Application No. 202010883853.X, entitled, "PERIODIC REDUCED WORD LINE BIAS WHICH INCREASES CHANNEL BOOSTING," filed Aug. 28, 2020, incorporated by reference herein in its entirety.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings, for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 2 is a block diagram depicting one embodiment of the sense block 51 of FIG. 1A.

FIG. 7A depicts an example view of NAND strings in the block B0-0 which is consistent with FIGS. 4 and 6.

FIG. 7B depicts an example top view of the block B0-0 of FIG. 7A, with respective NAND strings, bit lines and sense circuits.

FIG. 12B depicts boosting in a channel of a NAND string when a program disturb countermeasure such as discussed in connection with FIG. 12A is used, where the countermeasure involves applying VpassL to designated word lines including WLn+3, WLn+6, WLn+9 . . . , such that WL_dVpass_init=3 and WL_dVpass_period=3.

FIG. 13 depicts boosting in a channel of a NAND string when a program disturb countermeasure such as discussed in connection with FIG. 10A is used, where the countermeasure involves applying VpassL to designated word lines including WLn−4, WLn−7, WLn−10 . . . and WLn+4, WLn+7, WLn+10 . . . , such that WL_dVpass_init=4 and WL_dVpass_period=3.

FIG. 16 depicts boosting in a channel of a NAND string when a program disturb countermeasure such as discussed in connection with FIG. 10A is used, where the countermeasure involves applying VpassL−, VpassL and VpassL+ to designated word lines including WLn−2, WLn−5, WLn−9, respectively, and to WLn+2, WLn+5, WLn+9, respectively, such that the pass voltage for the designated word lines is progressively higher for designated word lines which are progressively further from the selected word line.

FIG. 18 depicts plots of channel voltage versus time, consistent with the voltage signals of FIG. 10A, for different values of dVpass.

FIG. 19 depicts plots of channel voltage versus time, consistent with the voltage signals of FIG. 10A, for different values of WL_dVpass_init, the number of word lines between WLn and the closest word line receiving VpassL.

FIG. 20 depicts plots of channel voltage versus time, consistent with the voltage signals of FIG. 10A, for different values of WL_dVpass_period, the interval between word lines receiving VpassL.

FIG. 23 depicts example voltage signals for performing a program operation, consistent with FIG. 22.

DETAILED DESCRIPTION

Figure 1A:
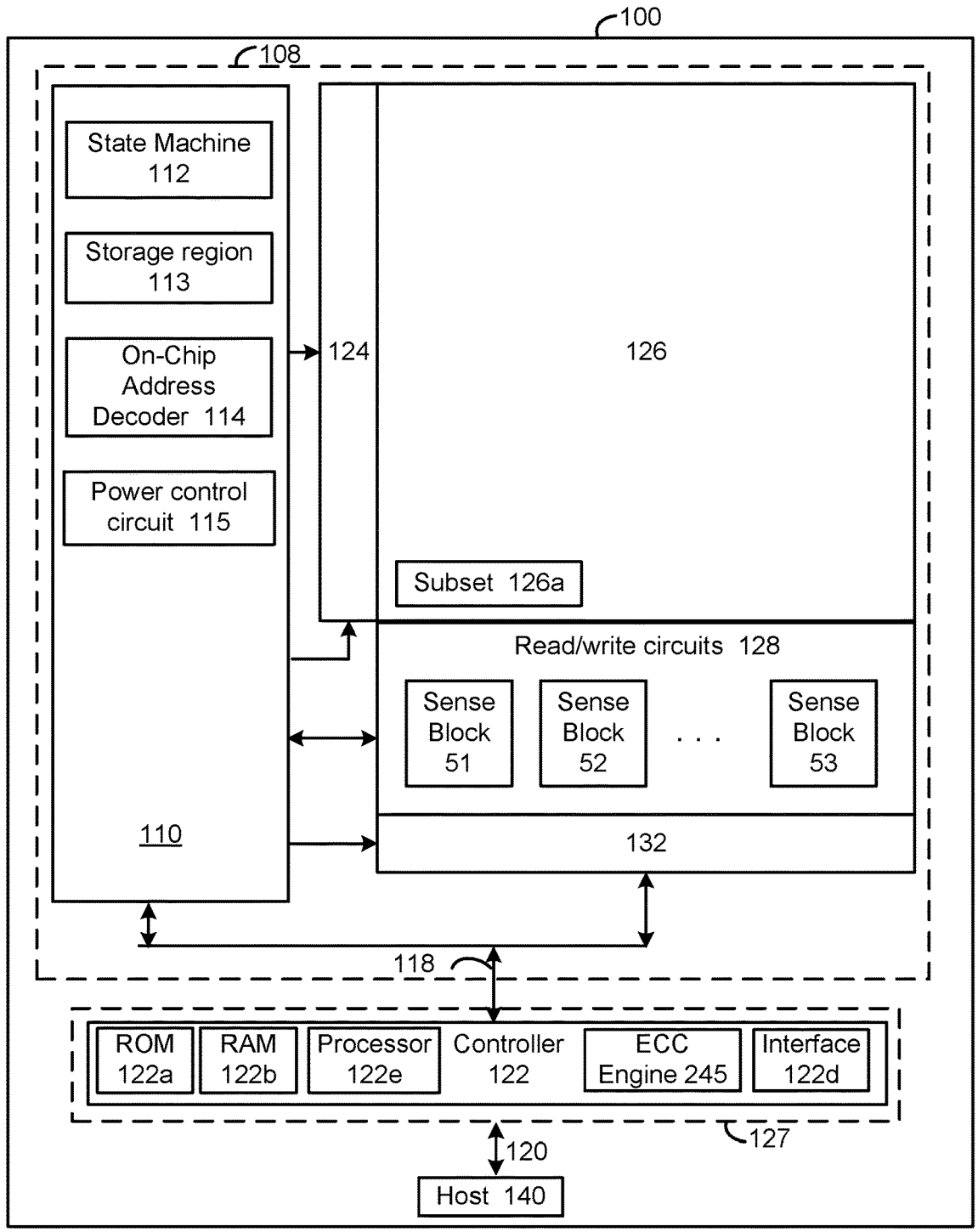
FIG. 1A is a block diagram of an example memory device.

Apparatuses and techniques are described for increasing channel boosting of NAND strings during programming by applying a periodic low word line bias.

In some memory devices, memory cells are joined to one another such as in NAND strings in a block or sub-block. Each NAND string comprises a number of memory cells connected in series between one or more drain end select gate transistors (referred to as SGD transistors), on a drain end of the NAND string which is connected to a bit line, and one or more source end select gate transistors (referred to as SGS transistors), on a source end of the NAND string or other memory string or set of connected memory cells, which is connected to a source line. The select gate transistors are also referred to as select gates. Further, the memory cells can be arranged with a common control gate line (e.g., word line) which acts a control gate. A set of word lines extends from the source-side of a block to the drain-side of a block. For example, see FIG. 7A. Memory cells can be connected in other types of strings and in other ways as well.

In a 3D memory structure, the memory cells may be arranged in vertical NAND strings in a stack in a substrate, where the stack comprises alternating conductive and dielectric layers. The conductive layers act as word lines which are connected to the memory cells. Each NAND string may have the shape of a pillar which intersects with the word lines to form the memory cells. Further, each NAND string includes various layers which extends vertically in the stack. For example, see the channel 660 and charge-trapping layer 664 in the NAND string 700n in FIG. 6. A source end 700s of the NAND string is connected to the substrate 611 and a drain end 700d of the NAND string is connected to a bit line, BL0.

In a 2D memory structure, the memory cells may be arranged in horizontal NAND strings on a substrate.

Figure 8:
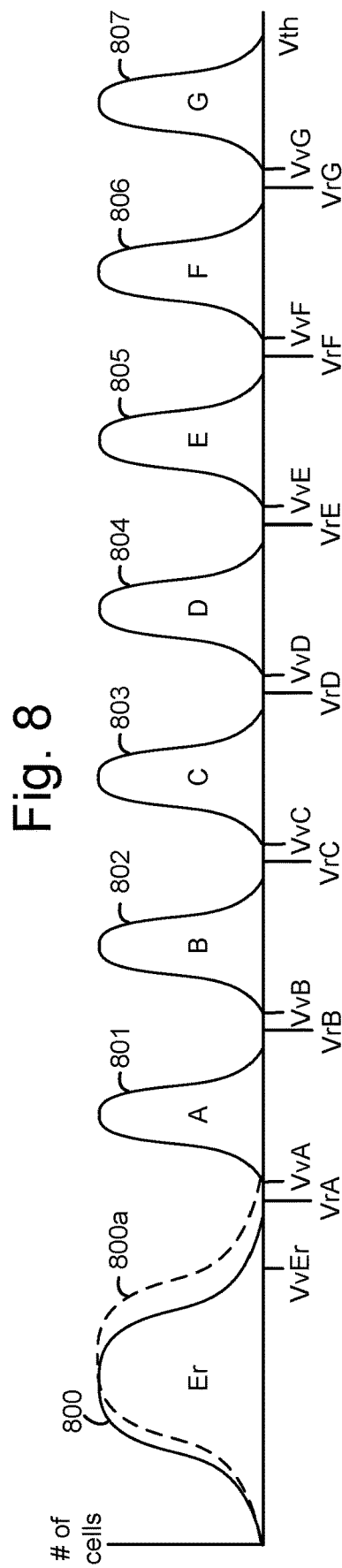
FIG. 8 depicts threshold voltage (Vth) distributions for an eight-state memory device.

A program operation for memory cells in a block typically involves applying a series of program pulses to a selected word line, WLn, while a pass voltage is applied to the unselected word lines. The word lines are connected to selected NAND strings, in which programming will occur, and unselected NAND strings, in which programming is inhibited. When the voltages of the word lines are ramped up, the voltage of the channels of the unselected NAND strings are increased or boosted, due to capacitive coupling to the word lines. This helps prevent program disturb or inadvertent programming of the memory cells in the unselected NAND strings connected to WLn. In particular, a higher boosting of the channel region adjacent to WLn can help reduce program disturb. The erased state memory cells are particularly susceptible to program disturb, as depicted in FIG. 8. One approach to increase the boosting level is to increase the pass voltage. However, the pass voltage itself could cause program disturb if it becomes too high. Moreover, program disturb is expected to become worse in 3D memory devices as the channel length of the NAND strings increases. This increase in channel length corresponds to an increase in the number of word lines in a block. For example, some blocks have 96 or more word lines.

Techniques provided herein address the above and other issues. In one aspect, a low pass voltage, VpassL, is applied to some of the word lines to create periodic low points or dips in the channel boosting level. See the example voltage signals for VpassL and Vpass in FIGS. 10A and 10B. These word lines are referred to as designated word lines. See the example dips 1201-1206 and the example designated word lines WLn−9, WLn−6, WLn−3, WLn+3, WLn+6, WLn+9 in FIG. 12A. The dips create barriers to the movement of electrons in the channel toward the selected word line, to prevent the electrons from pulling down the voltage at the channel region which is adjacent to the selected word line. See also FIG. 12A.

In one approach, VpassL is applied to designated word lines on both the source side and drain sides of WLn. See FIG. 12A. In another approach, VpassL is applied to one side of WLn but not the other side, based on the word line programming order. For example, VpassL can be applied to designated word lines on an unprogrammed side of the selected word line but not to programmed word lines on a programmed side of the selected word line. See FIGS. 12B and 12C, for example.

A control circuit can be configured with various parameters for implementing the technique. For example, a parameter WL_dVpass_init specifies a position of an initial designated word line which is closest to the selected word line. A parameter WL_dVpass_period specifies a period or interval of other designated word lines, relative to the initial designated word line. WL_dVpass_init can be equal to (see FIGS. 12A and 12B), or different than (see FIG. 13-16), WL_dVpass_period.

WL_dVpass_period can be fixed or varying. For example, it can increase progressively in a direction moving away from the selected word line as in FIGS. 15 and 16. A parameter dVpass specifies a difference between a nominal pass voltage, Vpass, and VpassL. Moreover, dVpass (and VpassL) can be fixed or varying. For example, dVpass can decrease (and VpassL can increase) progressively in a direction moving away from the selected word line as in FIG. 16.

WL_dVpass_period, dVpass and VpassL can also be a function of the selected word line position, since the likelihood of program disturb varies as a function of the selected word line position. See FIGS. 21A and 21B.

The portion of the NAND string in which the periodic dips are created can be a function of the WLn position. See FIG. 21C to 21E.

These and other features are discussed further below.

FIG. 1A is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be on a die 127 which is separate from the memory die 108. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, and a power control circuit 115. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control circuit 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control circuit 115, sense blocks 51, 52, . . . , 53, read/write circuits 128, controller 122, and so forth. The state machine is an electrical circuit that can control operations of the control circuitry 110. In some embodiments, the state machine is implemented by or replaced by a microprocessor, microcontroller and/or RISC processor.

The off-chip controller 122 (which in one embodiment is an electrical circuit) may comprise a processor 122e, memory such as ROM 122a and RAM 122b and an error-correction code (ECC) engine 245. The ECC engine can correct a number of read errors. The RAM 122b can be a DRAM which stores non-committed data, for example. During programming, a copy of the data to be programmed is stored in the RAM 122b until the programming is successfully completed. In response to the successful completion, the data is erased from the RAM 122b and is committed or released to the block of memory cells. The RAM 122b may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The memory in the controller 122, such as such as ROM 122a and RAM 122b, comprises code such as a set of instructions, and the processor is operable to execute the set of instructions to provide the functionality described herein. Alternatively or additionally, the processor can access code from a subset 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or the subset 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The controller, e.g., RAM 122b and/or the control circuitry 110, can store parameters which indicate an expected number of fail bits in a block. These parameters can include, e.g., the number of bits per cell stored in the memory cells, a portion of the word lines which are programmed in a block or sub-block, a portion of the sub-blocks which are programmed in a block, a strength of an ECC process used to store and read data in the block, a duration of pre-read voltage pulse, if used, and a read accuracy, such as a bit line or word line voltage settling time and a number of sensing passes.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable memory devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 1B:
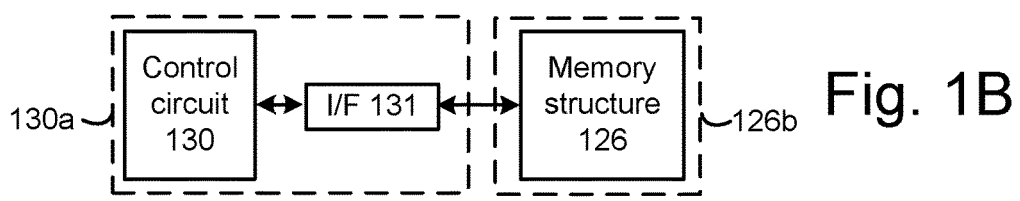
FIG. 1B is a block diagram of an arrangement of the memory device 100 of FIG. 1A in which a control circuit 130 on a first die 130a communicates with the memory structure 126 on a separate second die 126b.

FIG. 1B is a block diagram of an arrangement of the memory device 100 of FIG. 1A in which a control circuit 130 on a first die 130a communicates with the memory structure 126 on a separate second die 126b. The control circuit may communicate with the memory structure and the die 126b via a memory interface 131, for example, similar to the memory interface 122d. Examples of a memory interface (I/F) include the Common Flash Memory Interface of JEDEC. The techniques described herein can be implemented with a control die 130a bonded to one or more memory die 126b, where the memory die includes the memory structure 126 and the control die includes a control circuit 130 representing all, or subset, of the peripheral circuits of the memory structure. The control circuit can be on the same die as the plurality of memory cells, or on a different die than the plurality of memory cells.

For example, the memory structure may contain non-volatile memory cells. In some embodiments, the memory die and the control die are bonded together. The control circuit 130 can comprise a set of electrical circuits that perform memory operations (e.g., write, read, erase and others) on the memory structure. The control circuit can include the state machine 112, storage region 113, on-chip address decoder 114 and power control circuit 115. In another embodiment, one portion of the read/write circuits 128 are located on the control die 130a and another portion of the read/write circuits are located on memory die 126b. For example, the read/write circuits may contain sense amplifiers. The sense amplifiers can be located on the control die and/or the memory die.

In an example implementation, the control circuit 130 is configured to connect to a plurality of word lines, the plurality of word lines are connected to memory cells in a NAND string, and the memory interface 131 is connected to the control circuit. The circuit is configured to issue a command via the memory interface to apply a plurality of voltage signals to the plurality of word lines to boost a voltage of the channel of the NAND string.

The term "memory die" can refer to a semiconductor die that contains non-volatile memory cells for storage of data. The term, "control circuit die" can refer to a semiconductor die that contains control circuitry for performing memory operations on non-volatile memory cells on a memory die. Typically, numerous semiconductor die are formed from a single semiconductor wafer.

FIG. 2 is a block diagram depicting one embodiment of the sense block 51 of FIG. 1A. An individual sense block 51 is partitioned into one or more core portions, referred to as sense circuits 60-63 or sense amplifiers, and a common portion, referred to as a managing circuit 190. In one embodiment, each sense circuit is connected to a respective bit line and NAND string, and a common managing circuit 190 is connected to a set of multiple, e.g., four or eight, sense circuits. Each of the sense circuits in a group communicates with the associated managing circuit via data bus 176. Thus, there are one or more managing circuits which communicate with the sense circuits of a set of storage elements (memory cells).

The sense circuit 60, as an example, operates during a program loop to provide a pre-charge/program-inhibit voltage to an unselected bit line or a program-enable voltage to a selected bit line. An unselected bit line is connected to an unselected NAND string and to an unselected memory cell therein. An unselected memory cell can be a memory cell in an unselected NAND string, where the memory cell is connected to a selected or unselected word line. An unselected memory cell can also be a memory cell in a selected NAND string, where the memory cell is connected to an unselected word line. A selected bit line is connected to a selected NAND string and to a selected memory cell therein.

The sense circuit 60 also operates during a verify test in a program loop to sense a memory cell to determine whether it has completed programming by reaching an assigned data state, e.g., as indicated by its Vth exceeding the verify voltage of the assigned data state. The sense circuit 60 also operates during a read operation to determine the data state to which a memory cell has been programmed. The sense circuit 60 also operates in an erase operation during a verify test to determine whether a plurality of memory cells have a Vth below a verify voltage. As described further below, a verify test can be performed for the memory cells connected to all of the word lines in a block, or to memory cells connected to odd- or even-numbered word lines. The sense circuit performs sensing by determining whether a conduction current in a connected bit line is above or below a predetermined threshold level. This indicates whether the Vth of the memory cell is below or above, respectively, the word line voltage.

The sense circuit may include a selector 56 or switch connected to a transistor 55 (e.g., an nMOS). Based on voltages at the control gate 58 and drain 57 of the transistor 55, the transistor can operate as a pass gate or as a bit line clamp. When the voltage at the control gate is sufficiently higher than the voltage on the drain, the transistor operates as a pass gate to pass the voltage at the drain to the bit line (BL) at the source 59 of the transistor. For example, a program-inhibit voltage such as 1-2 V may be passed when pre-charging and inhibiting an unselected NAND string. Or, a program-enable voltage such as 0 V may be passed to allow programming in a selected NAND string. The selector 56 may pass a power supply voltage Vdd, e.g., 3-4 V to the control gate of the transistor 55 to cause it to operate as a pass gate.

When the voltage at the control gate is lower than the voltage on the drain, the transistor 55 operates as a source-follower to set or clamp the bit line voltage at Vcg-Vth, where Vcg is the voltage on the control gate 58 and Vth, e.g., 1 V, is the threshold voltage of the transistor 55. This assumes the source line is at 0 V. This mode can be used during sensing operations such as read and verify operations. The bit line voltage is thus set by the transistor 55 based on the voltage output by the selector 56. For example, the selector 56 may pass Vbl_sense+Vth, e.g., 1.5 V, to the transistor 55 to provide Vbl_sense, e.g., 0.5 V, on the bit line. A Vbl selector 173 may pass a relatively high voltage such as Vdd to the drain 57, which is higher than the control gate voltage on the transistor 55, to provide the source-follower mode during sensing operations. Vbl refers to the bit line voltage.

The Vbl selector 173 can pass one of a number of voltage signals. For example, the Vbl selector can pass a program-inhibit voltage signal which increases from an initial voltage, e.g., 0 V, to a program inhibit voltage, e.g., Vbl_inh for respective bit lines of unselected NAND string during a program loop. The Vbl selector 173 can pass a program-enable voltage signal such as 0 V for respective bit lines of selected NAND strings during a program loop. The Vbl selector may select a voltage signal from the BL voltage driver 340 in FIG. 3 based on commands from the processor 192, for example.

In one approach, the selector 56 of each sense circuit can be controlled separately from the selectors of other sense circuits. The Vbl selector 173 of each sense circuit can also be controlled separately from the Vbl selectors of other sense circuits During sensing, a sense node 171 is charged up to an initial voltage, Vsense_init, such as 3 V. The sense node is then passed to the bit line via the transistor 55, and an amount of decay of the sense node is used to determine whether a memory cell is in a conductive or non-conductive state. In particular, the comparison circuit 175 determines the amount of decay by comparing the sense node voltage to a trip voltage at a sense time. If the sense node voltage decays below the trip voltage, Vtrip, the memory cell is in a conductive state and its Vth is at or below the verify voltage. If the sense node voltage does not decay below Vtrip, the memory cell is in a non-conductive state and its Vth is above the verify voltage. A sense node latch 172 is set to 0 or 1, for example, by the comparison circuit 175 based on whether the memory cell is in a conductive or non-conductive state, respectively. The data in the sense node latch can be a bit which is read out by the processor 192 and used to update a trip latch 174. Subsequently, for a next program loop, a bit in the trip latch can be used by the processor, along with the assigned data state in the latches 194-197 to determine whether a memory cell and NAND string are selected or unselected for programming in the program loop, and to thereby pass the appropriate enable or inhibit bit line voltage, respectively, to the bit line. The latches 194-197 may be considered to be data latches or user data latches because they store the data to be programmed into the memory cells.

The managing circuit 190 comprises a processor 192, four example sets of data latches 194-197 for the sense circuits 60-63, respectively, and an I/O interface 196 coupled between the sets of data latches and the data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 176. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120. During reprogramming, a respective set of data latches of a memory cell can store data indicating when to enable the memory cell for reprogramming based on the program pulse magnitude.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
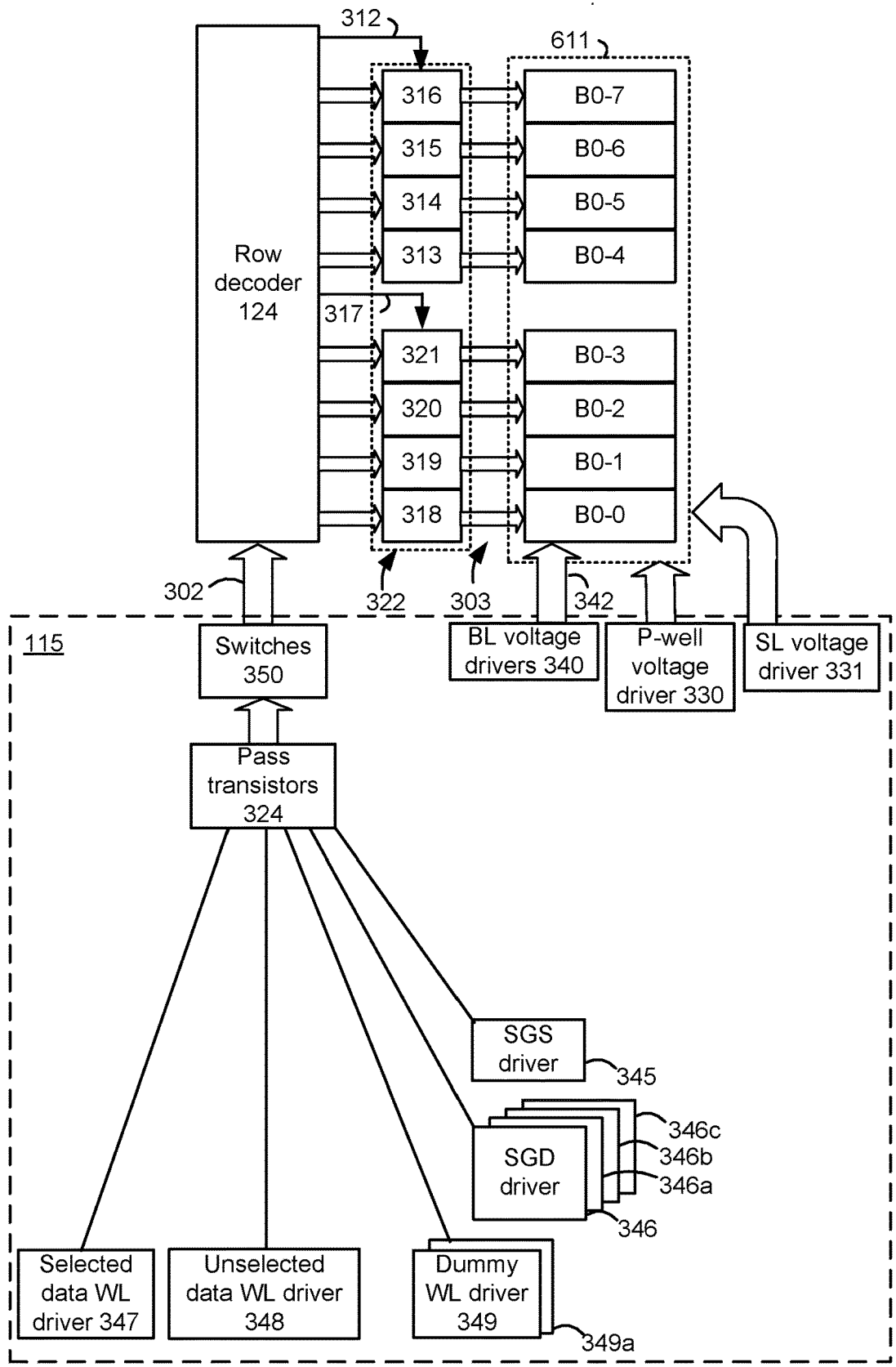
FIG. 3 depicts an example implementation of the power control circuit 115 of FIG. 1A for providing voltages to blocks of memory cells in a plane.

FIG. 3 depicts an example implementation of the power control circuit 115 of FIG. 1A for providing voltages to blocks of memory cells in a plane. The circuitry shown can be repeated for each plane of a die, in one approach. In this example, the memory structure 126 includes a set of four related blocks, B0-0 to B0-3, and another set of four related blocks, B0-4 to B0-7. See also FIG. 4. The blocks can be in one or more planes. The row decoder 124 of FIG. 1A provides voltages to word lines and select gate control lines of each block via pass transistors 322. In one approach, a separate row decoder is provided for each block. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 312 is connected to sets of pass transistors 313-316, which in turn are connected to control gate lines of B0-4 to B0-7, respectively. A control gate line 317 is connected to sets of pass transistors 318-321, which in turn are connected to control gate lines of B0-0 to B0-3, respectively.

Typically, program or read operations are performed on one selected sub-block at a time in a block. An erase operation may be performed on a selected block or subblock. The row decoder can connect global control lines 302 to local control lines 303. The control lines represent conductive paths. Voltages are provided on the global control lines from a number of voltage drivers. Some of the voltage drivers may provide voltages to switches 350 which connect to the global control lines. Pass transistors 324 are controlled to pass voltages from the voltage drivers to the switches 350.

The voltage drivers can include a selected data word line (WL) driver 347, which provides a voltage on a data word line selected during a program or read operation. The driver 347 can provide a pre-charge voltage and a program voltage on WLn during a program loop of a program operation. A driver 348 can be used for unselected data word lines, and dummy word line drivers 349 and 349a can be used to provide voltages on dummy word lines WLDD and WLDS, respectively, in FIG. 6.

The voltage drivers can also include separate SGD drivers for each sub-block. For example, SGD drivers 346, 346a, 346b and 346c can be provided for SB0, SB1, SB2 and SB3, respectively, such as in FIG. 7A. The SGD drivers provide a voltage to a control line connected to the control gates of an SGD transistor (drain-side select gate transistor). In one option, an SGS driver 345 is common to the different sub-blocks in a block, and provides a voltage to a control line connected to the control gates of the SGS transistors (source-side select gate transistors).

The various components, including the row decoder, may receive commands from a controller such as the state machine 112 or the controller 122 to perform the functions described herein.

The p-well voltage driver 330 provides a voltage Vp-well to the p+contact 612b in the p-well region 611b, e.g., via the conductive path 682. See FIG. 6. In one approach, the p-well region 611b is common to the blocks. Vp-well can be the same as Verase in FIGS. 12 and 13. A set of bit lines 342 is also shared by the blocks. The source line (SL) voltage driver 331 provides a voltage Vsl to the n+contact 612c in the p-well region 611b, e.g., via the local interconnect 651.

Bit line voltage drivers 340 include voltage sources which provide voltages to the bit lines 342. The bit line voltage for sensing in an erase verify test can be 0.5 V, for example.

In a stacked memory device such as depicted in FIGS. 4 to 7B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4:
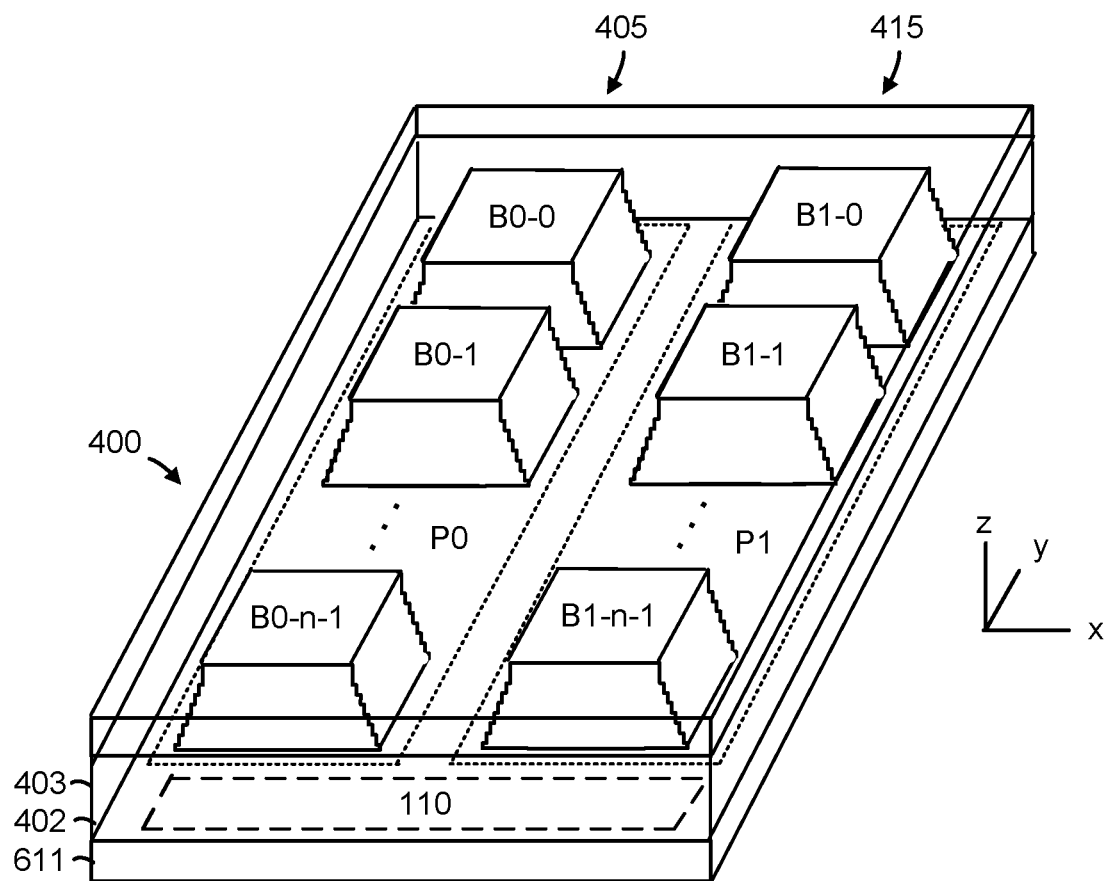
FIG. 4 is a perspective view of an example memory die 400 in which blocks are provided in respective planes P0 and P1, consistent with FIG. 1A.

FIG. 4 is a perspective view of an example memory die 400 in which blocks are provided in respective planes P0 and P1, consistent with FIG. 1A. The memory die includes a substrate 611, an intermediate region 402 in which blocks of memory cells are formed, and an upper region 403 in which one or more upper metal layers are patterned such as to form bit lines. Planes P0 and P1 represent respective isolation regions which are formed in the substrate 611. Further, a first block sequence 405 of a number n blocks, labelled B0-0 to B0-*n*-1, are formed in P0, and a second block sequence 415 of a number n blocks, labelled B1-0 to B1-*n*-1, are formed in P1. Each plane may have associated row and column control circuitry, such as the row decoder 124, read/write circuits 128 and column decoder 132 of FIG. 1A.

The control circuitry 110, which may be located in a peripheral area of the die, may be shared among the planes, in one approach. Each plane may have a separate set of bit lines.

By providing blocks of memory cells in multiple planes, parallel operations can be performed in the planes. For example, blocks in a different planes can be erase concurrently.

The substrate 611 can also carry circuitry under the blocks, and one or more lower metal layers which are patterned in conductive paths to carry signals of the circuitry.

In this example, the memory cells are formed in vertical NAND strings in the blocks. Each block comprises a stacked area of memory cells, where alternating levels of the stack represent word lines. In one possible approach, each block has opposing tiered sides from which vertical contacts extend upward to an upper metal layer to form connections to conductive paths. While two planes are depicted as an example, other examples can use four or more planes. One plane per die is also possible.

While the above example is directed to a 3D memory device with vertically extending NAND strings, the techniques provided herein are also applicable to a 2D memory device in which the NAND strings extend horizontally on a substrate.

Figure 5:
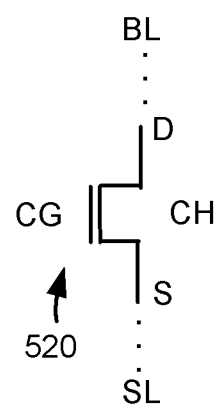
FIG. 5 depicts an example transistor 520 in the memory structure 126 of FIG. 1A.
Figure 6:
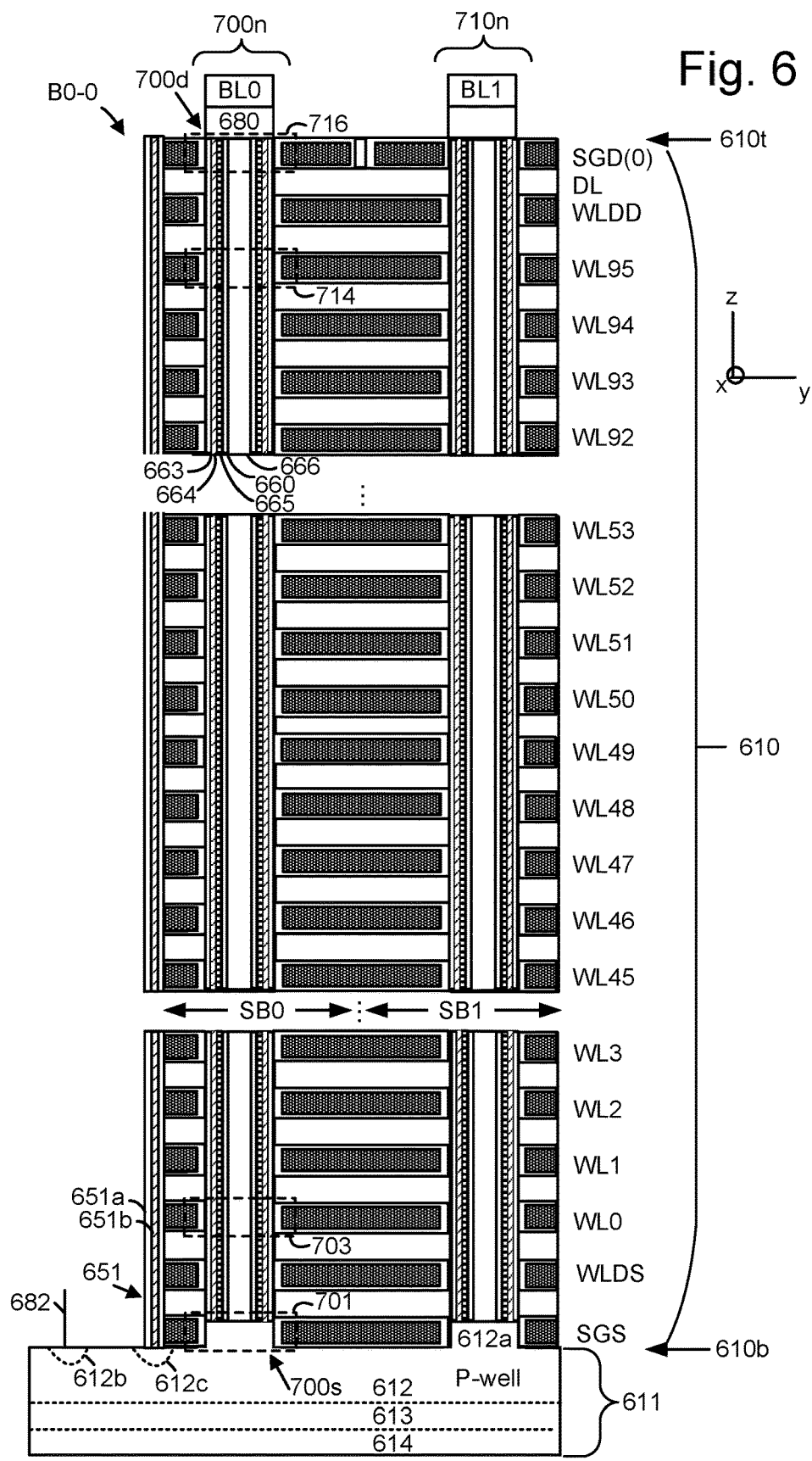
FIG. 6 depicts an example cross-sectional view of a portion of the block B0-0 of FIG. 4, including NAND strings 700n and 710n.

FIG. 5 depicts an example transistor 520 in the memory structure 126 of FIG. 1A. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6 depicts an example cross-sectional view of a portion of the block B0-0 of FIG. 4, including NAND strings 700n and 710n. In this example, the NAND strings 700n and 710n are in different sub-blocks SB0 and SB1, respectively. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). There are 96 data word lines in this example, although the number of data word lines could be greater or less than 96. In another example implementation, there are 160 data word lines.

The conductive layers connected to control gates of memory cells are referred to as word lines, and the conductive layers connected to control gates of source-side select gate transistors and drain-side select gate transistors are referred to as source-side and drain-side control lines, respectively. WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. DL is an example dielectric layer.

A top 610t and bottom 610b of the stack are depicted. WL95 is the topmost data word line or conductive layer and WL0 is the bottommost data word line or conductive layer.

The NAND strings are formed by etching memory holes in the stack, then depositing multiple thin layers of materials along the sidewalls of the memory holes. Memory cells are formed in a region in which the word lines intersect with the multiple thin layers, and select gate transistors are formed in regions in which the SGS and SGD control lines intersect with the multiple thin layers. For example, a drain-side select gate transistor 716 is formed where the SGD control line intersects with the multiple thin layers, a source-side select gate transistor 701 is formed where the SGS control line intersects with the multiple thin layers, a topmost data memory cell 714 is formed where the WL95 word line intersects with the multiple thin layers, and a bottom most data memory cell 703 is formed where the WL0 word line intersects with the multiple thin layers.

The multiple thin layers can form annular layers and can be deposited, e.g., using atomic layer deposition. For example, the layers can include a blocking oxide layer 663, a charge-trapping layer 664 or film such as silicon nitride (Si3N4) or other nitride, a tunneling layer 665 (e.g., a gate oxide) and a channel 660 (e.g., comprising polysilicon). A dielectric core 666 (e.g., comprising silicon dioxide) can also be provided. A word line or control line can comprise a metal such as Tungsten. In this example, all of the layers are provided in the memory hole. In other approaches, some of the layers can be provided in the word line or control line layer. The multiple thin layers form a columnar active area (AA) of a NAND string.

The stack is formed on a substrate 611. In one approach, the substrate includes a p-well region 611a (see also FIG. 3) connected to the source ends of the NAND strings. The p-well region may comprise epitaxial regions 612 which extend upward adjacent to the source-side select gate transistors. The p-well region can include an n+contact 612c connected to a local interconnect 651 for receiving a source line voltage, and a p+contact 612b connected to a conductive path 682 for receiving a p-well voltage. The local interconnect 651 can comprise a conductive material 651b such as metal surrounded by insulating material 651a to prevent conduction with the metal of the adjacent word lines. The p-well region is formed in an n-well 613, which in turn is formed in a p-type semiconductor region 614 of the substrate, in one possible implementation.

The NAND string 700n has a source end 700s at a bottom 610b of the stack 610, connected to the p-well. The NAND string 700n also has a drain end 700d at a top 610t of the stack, connected to a bit line BL0 via a bit line contact 680 comprising an n-type material.

The NAND strings can be considered to have a floating body channel because the length of the channel is not formed on a substrate.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the channels of the NAND string are charged up, such as by applying a positive erase pulse to the substrate via the local interconnect 651, causing the electrons to return to the channel from the charge trapping layer.

FIG. 7A depicts an example view of NAND strings in the block B0-0 which is consistent with FIGS. 4 and 6. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB3, then programming WL1 in SB0, SB1, SB2 and then SB3, and so forth. The word line programming order may start at WL0, the source end word line and end at WL95, the drain end word line, for example. In another example, in a reverse programming order, the word line programming order starts at the drain end word line and ends at the source end word line.

In an erase operation, typically the entire block is erased, although a partial block erase is also possible.

The plurality of memory cells of B0-0 are arranged in NAND strings, where each NAND string comprising a continuous charge trapping layer along a length of the NAND string. The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain end of each NAND string, and one SGS transistor at the source end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 7B depicts an example top view of the block B0-0 of FIG. 7A, with respective NAND strings, bit lines and sense circuits. The view is in the x-y plane. Each circle represents a NAND string. In this example, sixteen NAND strings per sub-block are depicted. SB0 includes the NAND string 700n of FIG. 7A and additional NAND strings 700n1-700n15. SB1 includes the NAND string 710n of FIG. 7A and additional NAND strings 710n1-710n15. SB2 includes the NAND string 720n of FIG. 7A and additional NAND strings 720n1-720n15. SB3 includes the NAND string 730n of FIG. 7A and additional NAND strings 730n1-730n15.

A set of bit lines BL0-BL15 are connected to the NAND strings. Each bit line is connected to a respective set of NAND strings, including one NAND string in each sub-block. For example, BL0 is connected to NAND strings 700n, 710n, 720n and 730n in a set of NAND strings 799, BL1 is connected to NAND strings 700n1, 710n1, 720n1 and 730n1, and so forth. Each bit line is also connected to a respective sense circuit, consistent with the sense circuits 60-63 of FIG. 2. For example, BL0-BL15 are connected to sense circuits SC0-SC15, respectively.

FIG. 8 depicts threshold voltage (Vth) distributions for an eight-state memory device. Eight data states, or three bits per cell, are depicted as an example. The techniques herein can apply to other modes include one or more bits per cell. The vertical axis depicts a number of memory cells on a logarithmic scale and the horizontal axis depicts a threshold voltage on a linear scale. The Vth distributions can represent memory cells connected to a word line or all memory cells in a block. After erasing the block, the Vth distribution 800 is obtained, representing the erased state. The erase operation is completed when the Vth of all, or nearly all, of the memory cells is below a verify voltage of VvEr.

The memory cells are then subject to a programming operation. Each of the memory cells will have an assigned data state. Some of the memory cells are assigned to the erased state and are not programmed. Most of the memory cells are programmed to higher states, such as A-F, in this example, as represented by Vth distributions 801-807, respectively. These memory cells are subject to verify tests using verify voltages of VvA-VvG. The programming of the higher state memory cells can disturb the erased state memory cells connected to WLn, as mentioned at the outset, resulting in the widened and upshifted Vth distribution 800a. A disturb referred to as Vpass disturb can also be caused in erased state memory cells connected to the unselected word lines by the application of a pass voltage.

Figures 9A, 9B:
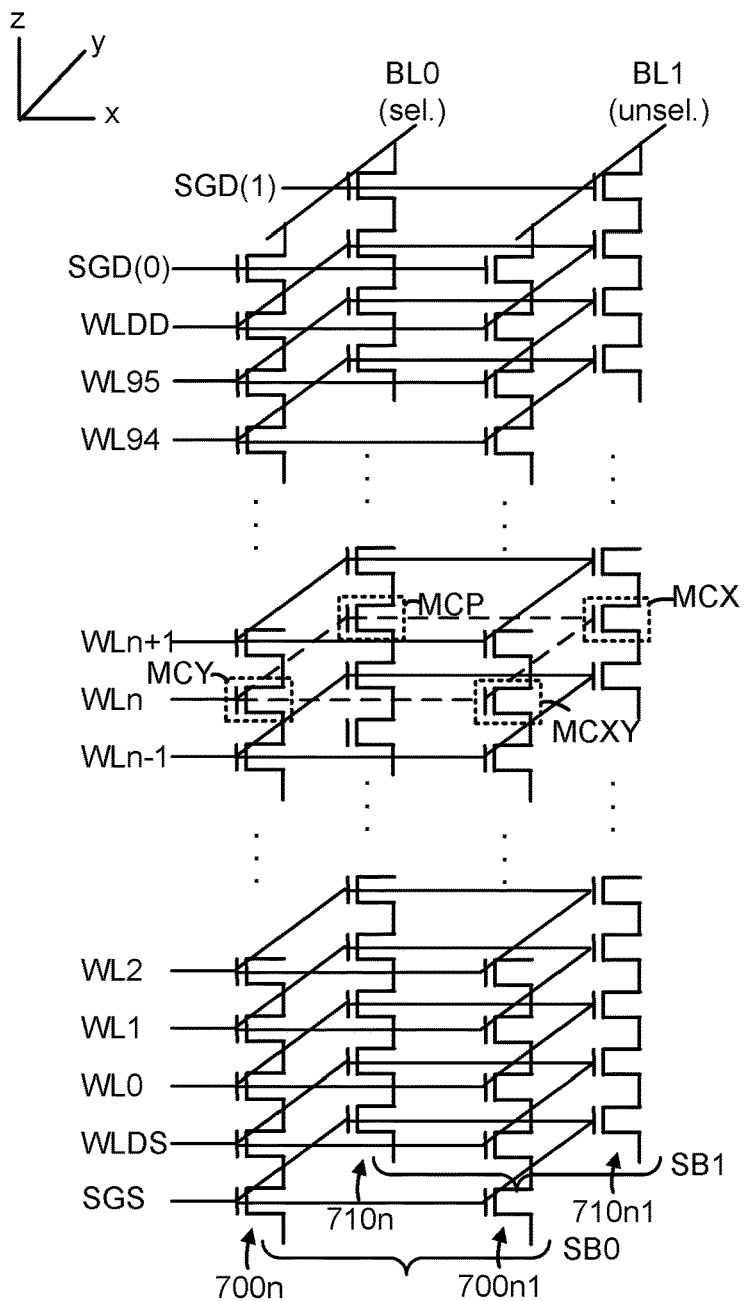
FIG. 9A depicts an example of memory cells which experience program disturb.
FIG. 9B depicts a table of voltages used when the different types of program disturb of FIG. 9A occur.

FIG. 9A depicts an example of memory cells which experience program disturb. The memory cells are arranged in NAND strings 700n, 710n, 700n1 and 710n1, consistent with FIGS. 7A and 7B. The word lines include WL0, WL1, WL2, . . . , WLn−1, WLn, WLn+1, . . . , WL94 and WL95. In this example, the memory cell MCP is selected for programming, so that the NAND string 710n is a selected NAND string. The memory cells MCX, MCY and MCXY are unselected for programming so that the NAND strings 700n, 700n1 and 710n1 are unselected NAND strings. Referring to the x, y and z coordinate system, MCX is in an x direction, MCY is in a y direction and MCXY is in an x and y direction relative to MCP. Each of these example memory cells is connected to WLn, the selected word line. BL0 is a selected bit line since it is connected to a selected NAND string, and BL1 is an unselected bit line since it is not connected to a selected NAND string. The NAND strings may have a common source voltage and SGS voltage.

According to the architecture of the 3D memory device, program disturb can be classified into three modes, including X-mode, Y-mode and XY-mode. These modes are experienced by MCX, MCY and MCXY, respectively.

In the selected NAND string 710n, the SGD transistor is turned on (made conductive) by setting a positive Vsgd, which is common to all of the SGD transistors in SB1. The dummy word lines, WLDD and WLDS, may be biased with a respective voltage which is typically lower than the voltage of the data word lines. The data word lines receive a nominal pass voltage, Vpass, such as 9 V. The bit line BL0 is connected to ground to supply electrons for programming. As a result, during programming of MXP, the channel voltage is 0 V. With a high program voltage, Vpgm, such as 20 V applied to WLn, MXP is programmed.

In an inhibited NAND string, using the NAND string 700n1 which is subject to the XY mode program disturb as an example, the SGD transistor is turned off (made non-conductive) by setting Vsgd=0 V and BL1=Vddsa, a positive power supply voltage. This Vsgd is common to the SGD transistors in SB0. Biasing the SGS transistor with 0 V turns off the SGS transistor. As a result, the channel voltage floats along a length of the NAND string.

When the voltages of the unselected word lines are ramped up from an initial level such as 0 V to a final level, Vpass (see FIG. 10A), the channel potential in the NAND string 700n1, for example, is coupled up from 0 V to Vboost. This coupling up is due to the capacitance of the materials which form the NAND string and the word lines. For example, these materials can comprise a MONOS stack including a metal layer as the word line, a blocking oxide layer, a nitride charge trapping layer, an oxide tunneling layer and a polysilicon channel layer. When Vpgm is applied to WLn, an effective program voltage will occur in the inhibited NAND string as Vpgm-Vboost. This causes a relatively high stress on the inhibited memory cell MCXY which can cause program disturb, or upshifting of the memory cell's Vth. The stress is higher when Vboost is lower.

Vboost can be lowered by leakage of electrons from grain boundaries of the polysilicon channel. This leakage is expected to become worse in future memory devices in which channel length is increased. Such electrons can move toward a high voltage region of the channel which is adjacent to the selected word line. See FIG. 11. Vboost can vary for different channel regions based on the Vth of the corresponding memory cell. Vboost is proportional to Vpass-Vth. The actual boosting potential is therefore lower than the ideal.

FIG. 9B depicts a table of voltages used when the different types of program disturb of FIG. 9A occur. The first row indicates that, for a NAND string in a program mode (e.g., NAND string 710n), a positive voltage Vsgd is applied to the SGD transistor while Vb1=0 V to provide the SGD transistor in a conductive state. The second row indicates that, for a NAND string in an x mode (e.g., NAND string 710n1), Vsgd is applied to the SGD transistor while a positive voltage Vddsa is applied to the bit line voltage to provide the SGD transistor in a non-conductive state. The third row indicates that, for a NAND string in a y mode (e.g., NAND string 700n), 0 V is applied to the SGD transistor and Vbl=0 V to provide the SGD transistor in a non-conductive state. The fourth row indicates that, for a NAND string in an xy mode (e.g., NAND string 700n1), 0 V is applied to the SGD transistor and Vbl=Vddsa to provide the SGD transistor in a non-conductive state.

Figure 10A:
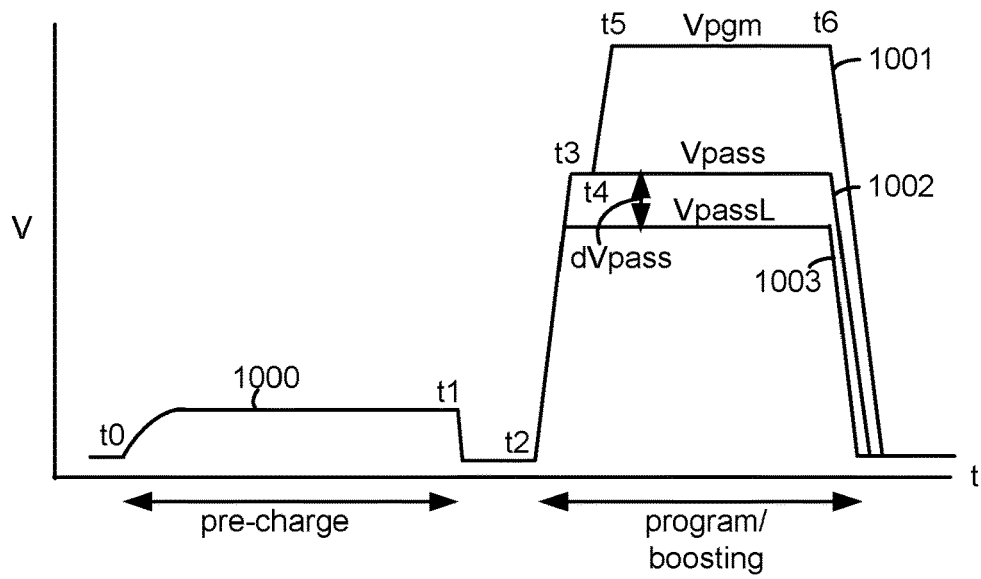
FIG. 10A depicts example voltage signals during a pre-charge phase and a program/boosting phase of a program operation which provides a countermeasure to the program disturb discussed in connection with FIG. 9A.

FIG. 10A depicts example voltage signals during a pre-charge phase and a program/boosting phase of a program operation which provides a countermeasure to the program disturb discussed in connection with FIG. 9A. The vertical axis depicts voltage and the horizontal axis depicts time. The pre-charge phase and the program/boosting phase occur in a program loop, where the program operation comprise multiple successive program loops. A verify phase is also used in a program loop, as depicted in FIG. 23. A plot 1000 depicts a voltage signal applied to both the selected and unselected word lines from time t0-t1. A positive voltage such as 2 V may be used to allow a bit line voltage to pre-charge the channel.

For the selected word line, a plot 1001 at t2-t6 depicts a voltage increasing from a respective initial level such as 0 V to a program voltage Vpgm and being held at Vpgm. The voltage may increase first from 0 V to Vpass and then from Vpass to Vpgm. For an undesignated unselected word line (e.g., an unselected word line which is not a designated word line), a plot 1002 at t2-t6 depicts a voltage increasing from a respective initial level such as 0 V to Vpass and being held at Vpass. For a designated unselected word line, a plot 1003 at t2-t6 depicts a voltage increasing from a respective initial level such as 0 V to VpassL and being held at VpassL, where VpassL<Vpass. VpassL can be applied to word lines arranged at intervals in a set of word lines to create dips in the boosting level of the channel.

Figure 10B:
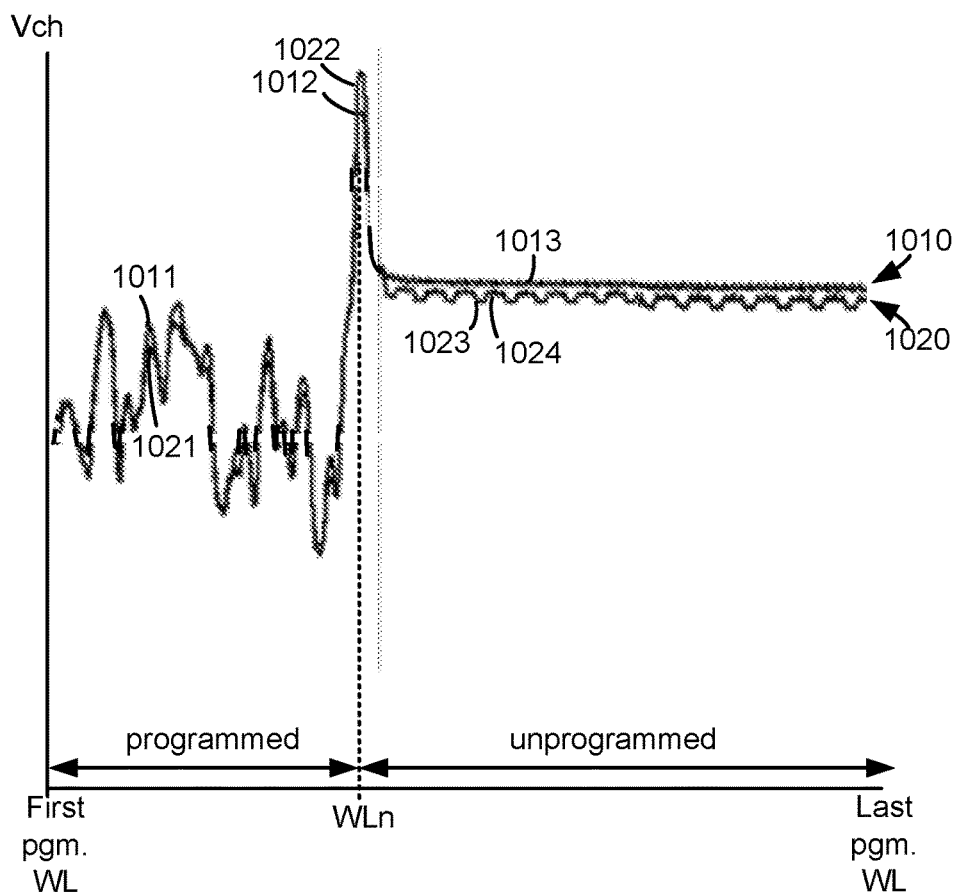
FIG. 10B depicts example plots of channel voltage versus position in a NAND string, using the different voltage signals of FIG. 10A.

FIG. 10B depicts example plots of channel voltage (Vch) versus position in a NAND string, using the different voltage signals of FIG. 10A. The position in the NAND string extends from a first-programmed (pgm.) WL at one end of the NAND string to a last-programmed WL at another end of the NAND string. For example, with a source-to-drain WL programming order, and with 96 word lines, the first-programmed WL is WL0 at the source end and the last-programmed WL is WL95 at the drain end. WLn denotes an example selected word line. The word lines on one side of WLn, e.g., below WLn in a block such as in FIG. 6A or 7A, were previously programmed at the time WLn is being programmed. This is denoted by "programmed" in the figure. As a result, Vch will be a function of the Vth of the memory cells as well as of the pass voltage. A higher Vth will result in a lower Vch, as mentioned. Vch varies significantly for these word lines due to the random data states programmed into the memory cells connected to these word lines.

The word lines on the other side of WLn, e.g., above WLn, are unprogrammed, e.g., not yet programmed at the time WLn is being programmed. This is denoted by "unprogrammed" in the figure. As a result, Vch will be a function mainly of the pass voltage. Vch is uniform when the program disturb countermeasure is not used (plot 1013), and has periodic dips when the program disturb countermeasure is used (plot 1020).

The word lines below WLn are WL0-WLn−1 and the word lines above WLn are WLn+1 to the final word line such as WL95 in FIGS. 6A and 7A.

A programmed word line refers to a word line for which programming has occurred for the memory cells connected to the word lines, according to a word line programming order of a block. The memory cells connected to a programmed word can include both programmed and erased state memory cells, typically in a random distribution of data states. An unprogrammed word line refers to a word line for which programming has not yet occurred for the memory cells connected to the word lines so that the memory cells are in the erased state. Moreover, programming a word line refers to programming the memory cells connected to the word lines.

A plot 1010 represents the case with a nominal pass voltage, Vpass, applied to all of the unselected word lines. This plot includes a portion 1011 for an unselected word line below WLn, a portion 1012 for the selected word line, and a portion 1013 for an unselected word line above WLn. A plot 1020 represents the case with the program disturb countermeasure. VpassL is applied to designated unselected word lines, and the nominal pass voltage Vpass applied to remaining unselected word lines which are between the designated unselected word lines. This plot includes a portion 1021 for an unselected word line below WLn, a portion 1022 for the selected word line, a portion 1023 for an example designated unselected word line above WLn, and a portion 1024 for an example undesignated unselected word line above WLn which receives Vpass. There can be a small lowering of the overall Vch when VpassL is used.

For WLn, Vch is higher when the program disturb countermeasure is used (plot 1022). Program disturb can therefore be reduced.

Figure 11:
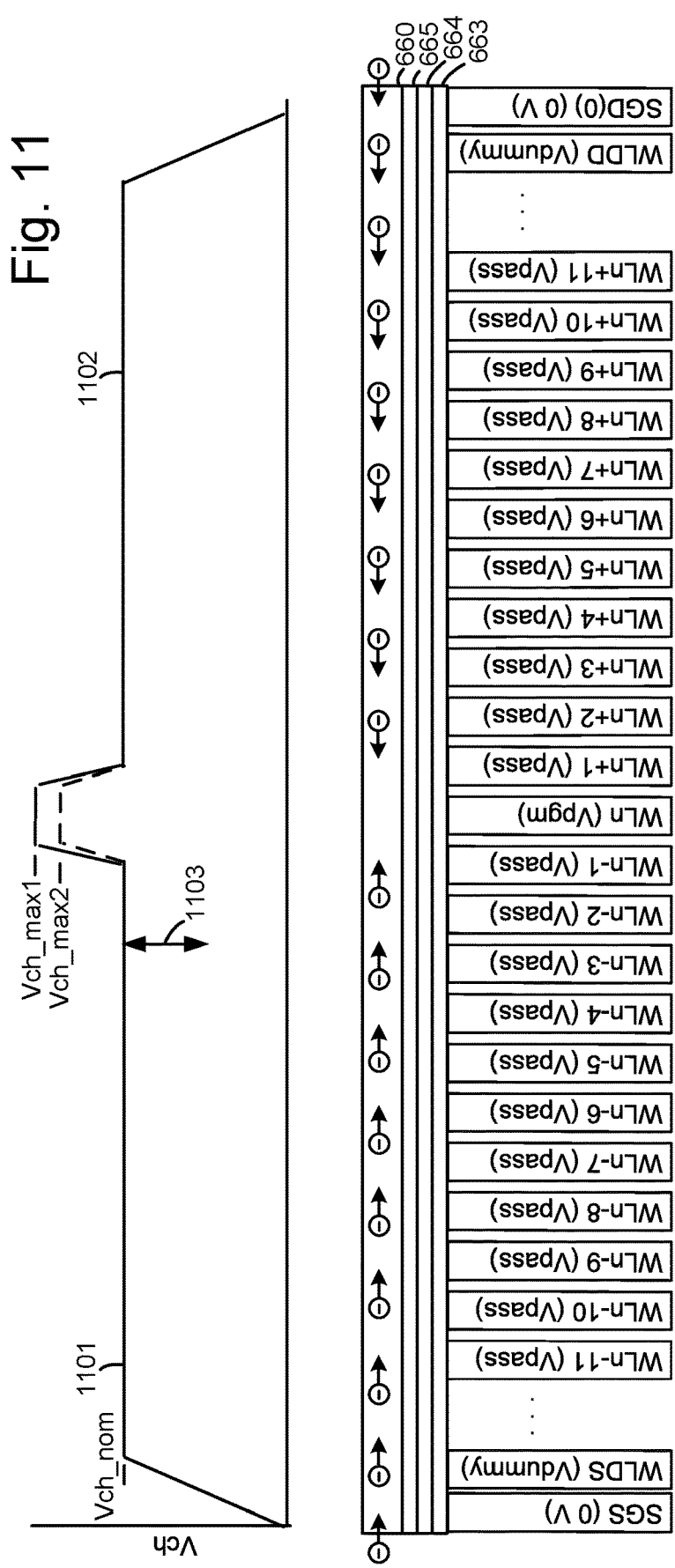
FIG. 11 depicts boosting in a channel of a NAND string when a program disturb countermeasure such as discussed in connection with FIG. 10A is not used.

FIG. 11 depicts boosting in a channel of a NAND string when a program disturb countermeasure such as discussed in connection with FIG. 10A is not used. FIGS. 11 to 16 include a plot which depicts Vch versus NAND string position, ranging from the source side to the drain side, during the application of Vpgm to a selected word line WLn during programming. The figure also depicts layers of the NAND string, including a blocking oxide layer 663, a charge-trapping layer 664, a tunneling layer 665 and a channel 660. The movement of electrons in the channel is also depicted, where an electron is shown by a circle with a line. An arrow shows the direction of movement. Control gate lines, including word lines and select gate lines, are adjacent to the layers of the NAND string. A voltage which is applied to the control gate lines is also depicted. Further, FIGS. 11 to 16 provide a simplified example in which the memory cells are all assumed to be in the erased data state. This simplified example helps demonstrate the theory of the program disturb countermeasure. FIG. 10B shows an actual case in which the memory cells connected to the source side word lines are programmed.

For example, the control gate lines and their voltages include: SGS (0 V), WLDS (Vdummy), ..., WLn−11 to WLn−1 (Vpass), WLn (Vpgm), WLn+1 to WLn+11 (Vpass), ..., WLDD (Vdummy) and SGD(0) (0 V). In one approach, 0 V<Vdummy<Vpass.

In this unselected NAND string, programming is inhibited and boosting is encouraged by turning off the SGD and SGS transistors to float Vch. The ramp up of the voltage of WLn from 0 V to Vpgm results in a peak Vch in the channel region adjacent to WLn of Vch_max1 with the program disturb countermeasure or Vch_max2 without the program disturb countermeasure. The ramp up of the voltage of the unselected word lines from 0 V to Vpass results in Vch nom in the adjacent channel regions, including the source side channel regions (plot 1101) and the drain side channel regions (plot 1102). The arrow 1103 depicts an example range of Vch in the source side channel when the associated memory cells are programmed. Vch nom is equal to Vpass multiplied by a coupling ratio of the word lines to the channel, e.g., 0.8-0.9. The lower peak of Vch_max2 represents the case of all of the unselected word lines being ramped up from 0 V to a common pass voltage, Vpass. The higher peak of Vch_max1 represents the case of some of the unselected word lines being ramped up from 0 V to VpassL while other word lines are ramped up from 0 V to Vpass, as discussed in connection with FIG. 12A to 16.

As mentioned, the channel is boosted by capacitance coupling due to the increasing word line voltages. Moreover, electrons in grain boundaries of the polysilicon channel can move toward a high voltage region of the channel which is adjacent to WLn. Electrons can also leak into the channel from the SGS and SGD transistors and move toward WLn. The increase in electrons or negative charges at WLn reduces the peak Vch from Vch_max1 to Vch_max2, for example.

By applying VpassL to designated word lines, periodic dips in Vch can be created which make it harder for the electrons to reach the channel region adjacent to WLn. Advantageously, this program disturb countermeasure be performed without increasing Vpass. Increasing Vpass could cause disturb of memory cells connected to unselected word lines as well as increasing power consumption. Program disturb can thereby be reduced in particular for memory cells in a 3D NAND string. Various examples for providing periodic dips in Vch are discussed below in connection with FIG. 12A to 16.

Figure 12A:
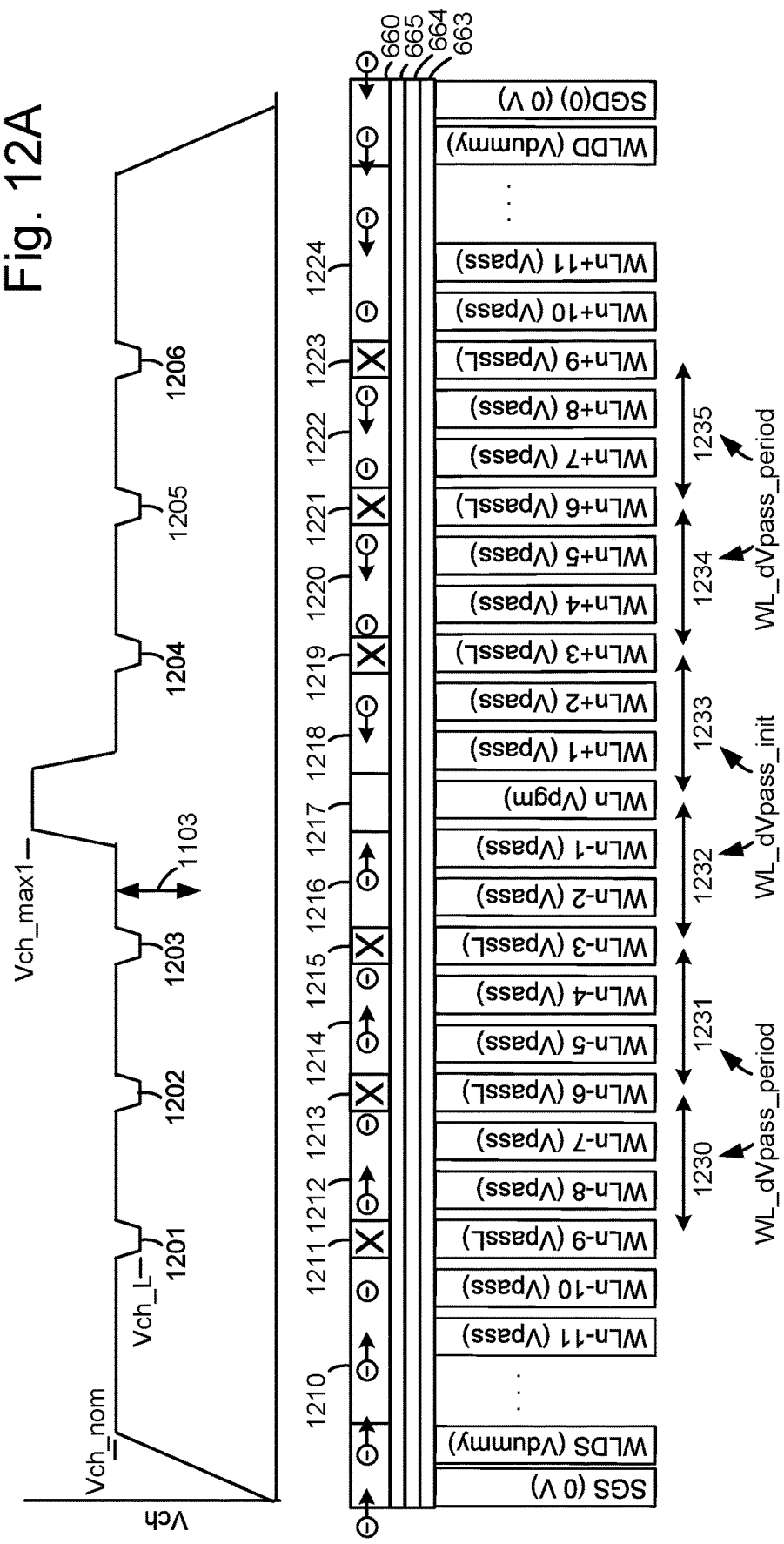
FIG. 12A depicts boosting in a channel of a NAND string when a program disturb countermeasure such as discussed in connection with FIG. 10A is used, where the countermeasure involves applying VpassL to designated word lines including WLn−3, WLn−6, WLn−9 . . . and WLn+3, WLn+6, WLn+9 . . . , such that WL_dVpass_init=3 and WL_dVpass_period=3.

FIG. 12A depicts boosting in a channel of a NAND string when a program disturb countermeasure such as discussed in connection with FIG. 10A is used, where the countermeasure involves applying VpassL to designated word lines including WLn−3, WLn−6, WLn−9 . . . and WLn+3, WLn+6, WLn+9 . . . , such that WL_dVpass_init=3 and WL_dVpass_period=3. Recall that the parameter WL_dVpass_init specifies a position of an initial designated word line (e.g., a word line designated to receive a lower pass voltage to create dips in the channel voltage which inhibit electron movement toward WLn) which is closest to the selected word line. A parameter WL_dVpass_period specifies a period or interval of other designated word lines, relative to the initial designated word line.

By applying VpassL to the designated word lines, corresponding dips are created in the channel voltage. For example, dips 1201, 1202 and 1203 created in channel regions 1211, 1213 and 1215, respectively, adjacent to WLn−9, WLn−6 and WLn−3, respectively. Similarly, dips 1204, 1205 and 1206 created in channel regions 1219, 1221 and 1223, respectively, adjacent to WLn+3, WLn+6 and WLn+9, respectively.

The "X" in these channel regions indicates that the dip creates a barrier to the movement of electrons. A higher nominal channel voltage is created in the channel regions which are between the channel regions of the designated word lines. For example, a nominal channel voltage is created in a channel region 1210 adjacent to WL0 to WLn−10, a channel region 1212 adjacent to WLn−8 and WLn−7, a channel region 1214 adjacent to WLn−5 and WLn−4, and a channel region 1216 adjacent to WLn−2 and WLn−1. Similarly, a nominal channel voltage is created in a channel region 1218 adjacent to WLn−1 and WLn−2, a channel region 1220 adjacent to WLn+4 and WLn+5, a channel region 1222 adjacent to WLn+7 and WLn+8, and a channel region 1224 adjacent to WLn+10 to the final word line, WL95 or WL159, for example.

The electrons will tend to be trapped in the channel in the areas of higher Vch, between the dips in Vch, and cling close to the interface between the polysilicon channel and the tunnel oxide. The electrons will be blocked from moving toward the channel region 1217 adjacent to WLn because of the potential barriers created by the dips in the channel. As a result, the drop in boosting potential at WLn is reduced, and the peak voltage Vch_max1 is achieved to minimize program disturb. Generally, a dip can be created by applying VpassL to one word line which is surround by multiple word lines which receive Vpass. It is possible to create a dip by applying VpassL to multiple word lines which are surround by word lines which receive Vpass.

The pattern of word line voltages can extend over the entire NAND string, in one option. For example, with word lines WL0 to WL95, and WLn=40, the word lines receiving VpassL can be: WL1, WL4, WL7, WL10, WL13, WL16, WL19, WL22, WL25, WL28, WL31, WL34, WL37, WL43, WL46, WL49, WL52, WL55, WL58, WL61, WL64, WL67, WL70, WL73, WL76, WL79, WL82, WL85, WL88, WL91 and WL94.

In another option, the pattern of word line voltages can extend over the unprogrammed word lines but not the programmed word lines. For example, see FIGS. 12B and 12C.

Generally, the patterns shown in FIG. 12A to 16 depict a portion of the NAND string for simplicity but can apply to the entire NAND string.

The pattern of word line voltages can extend over a majority of the length of the NAND string on both the source and drain sides, or just the source or drain side, but not both sides. Similarly, the periodic dips in the channel can extend over a majority of the length of the NAND string. Other options are possible as well.

The arrows 1232 and 1233 represent WL_dVpass_init, which is three word lines. That is, the unselected word line closest to WLn which receives VpassL is three word lines away from WLn, on the source and drain sides. Also, the unselected word line closest to WLn which receives VpassL is separated from WLn by two intervening word lines. The arrows 1230, 1231, 1234 and 1235 represent WL_dVpass_ period, which is three word lines. Thus, WL_dVpass_period=WL_dVpass_init in this example. The arrow 1230 and 1231 indicate that WLn−9 is three word lines away from WLn−6, and WLn−6 is three word lines away from WLn−3, respectively. In other words, with respect to WLn−3, the closest unselected word line to WLn which receives VpassL, every third word line after WLn−3 receives VpassL. VpassL is thus applied at a period or interval of three word lines.

Figure 15:
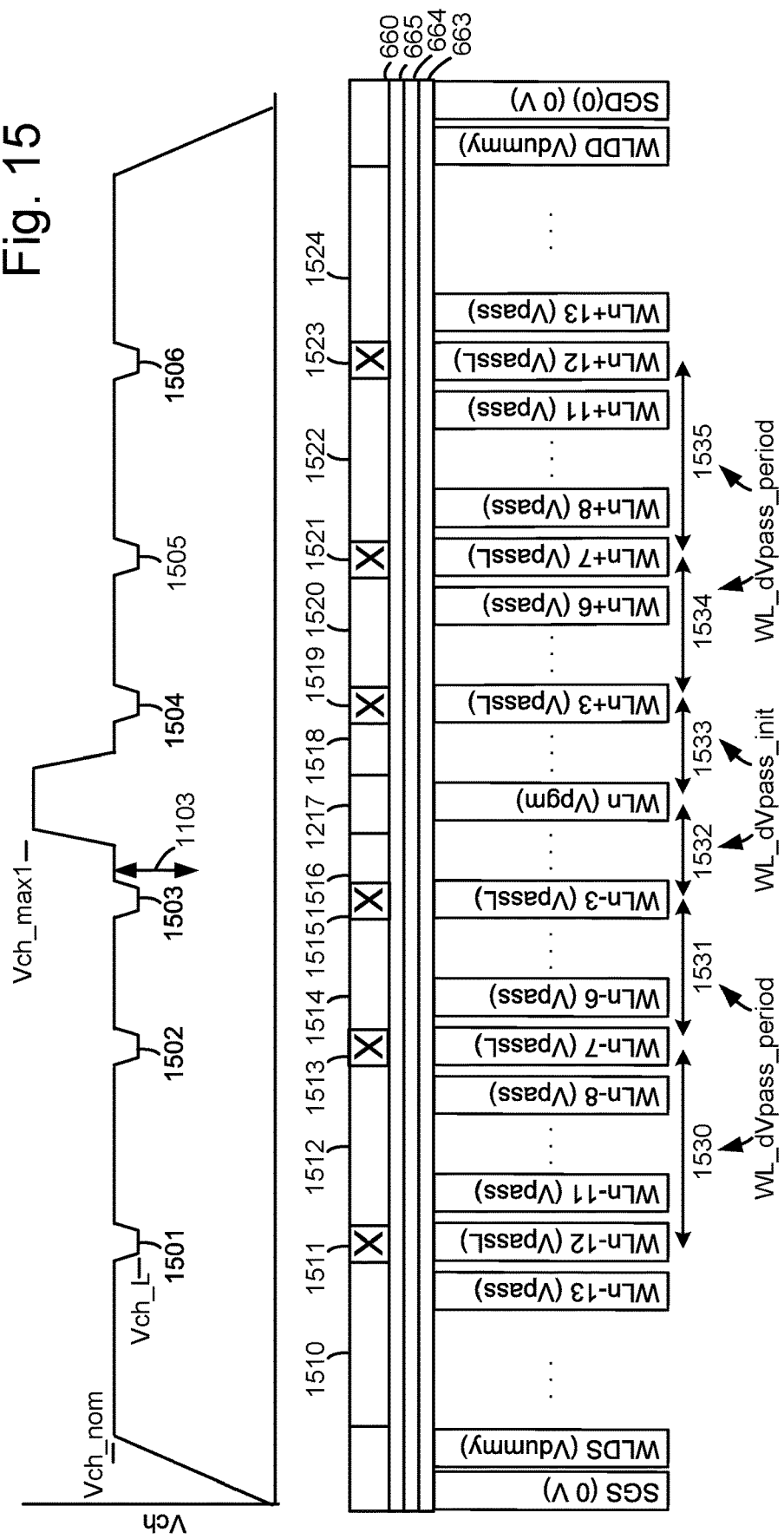
FIG. 15 depicts boosting in a channel of a NAND string when a program disturb countermeasure such as discussed in connection with FIG. 10A is used, where the countermeasure involves applying VpassL to designated word lines including WLn−3, WLn−7, WLn−12 . . . and WLn+3, WLn+7, WLn+12 . . . , such that the designated word lines are spaced at progressively larger intervals along the NAND string in a direction moving away from the selected word line.

WL_dVpass_init can be the same or different for the source side versus the drain side. WL_dVpass_period can be the same or different for the source side versus the drain side. WL_dVpass_period can also be fixed or varying on the source and/or drain side. For example, FIGS. 15 and 16 show a varying WL_dVpass_period.

The word lines which receive VpassL can be expressed as follows: WLn+/−(WL_dVpass_init+ α*WL_dVpass_period), where α=0, 1, 2, 3, 4 . . . . Further examples are provided below.

In one option, WLn−1 and/or WLn+1 receive a special pass voltage since they are adjacent to WLn. For example, WLn−1 and/or WLn+1 can receive a reduced pass voltage, which is less than Vpass and perhaps greater than VpassL. A lower pass voltage can be used on these word line because of a fringing field from the high Vpgm on WLn.

In this example, among the unselected word lines on the drain side of the selected word line (WLn to WL95), the pass voltage is lower for designated word lines (WLn+3, WLn+6, WLn+9 . . . ) spaced at intervals (shown by arrows 1234 and 1235) along the NAND string than for word lines (WLn+4, WLn+5, WLn+7, WLn+8) between the designated word lines.

Also, the designated word lines are spaced at equal intervals (three word lines apart or with two intervening word lines) along the NAND string. Also, among the designated word lines, a closest word line (WLn−3, WLn+3) to the selected word line is N(=3) word lines away from the selected word line, and the intervals each comprise N word lines.

Among the unselected word lines on the source and/or drain side of the selected word line, the pass voltage is lower for designated word lines spaced at intervals along the NAND string than for word lines between the designated word lines FIG. 12B depicts boosting in a channel of a NAND string when a program disturb countermeasure such as discussed in connection with FIG. 12A is used, where the countermeasure involves applying VpassL to designated word lines including WLn+3, WLn+6, WLn+9 . . . , such that WL_dVpass_init=3 and WL_dVpass_period=3. This approach is similar to that of FIG. 12A except that the dips in Vch are created on the drain side of WLn but not on the source side. In this example, the drain side word lines are unprogrammed so that the dips which are created in Vch are uniform. In contrast, Vch fluctuates randomly based on the programmed data states on the source side of WLn, such as shown in FIG. 10B, so that the effect of the dips is less predictable. The random variations in Vch on the source side can create dips in Vch which inhibit electron movement without applying VpassL on the source side.

This assumes a word line program order which begins at the source side of a NAND string and ends at the drain side. Other program orders are possible, such as beginning at the drain side of a NAND string and ending at the source side. In either case, the dips in Vch can be created on the unprogrammed side of WLn but not on the programmed side.

An arrow 1241 represents WL0 to WLn−1, which receive Vpass. A corresponding channel region 1240 is created in which electrons may move toward WLn. Recall that the arrow 1103 depicts an example range of Vch in the source side channel when the associated memory cells are programmed.

In another option, VpassL is applied to both programmed and unprogrammed designated word lines but the spacing between the unprogrammed designated word lines is smaller than between the programmed designated word lines based on the theory that it is more important to provide a shorter distance between Vch dips on the unprogrammed side of WLn than on the programmed side of WLn.

The pattern of word line voltages can extend over the entire drain side of WLn in one option. For example, with word lines WL0 to WL95, and WLn=40, the word lines receiving VpassL can be: WL43, WL46, WL49, WL52, WL55, WL58, WL61, WL64, WL67, WL70, WL73, WL76, WL79, WL82, WL85, WL88, WL91 and WL94.

Figure 12C:
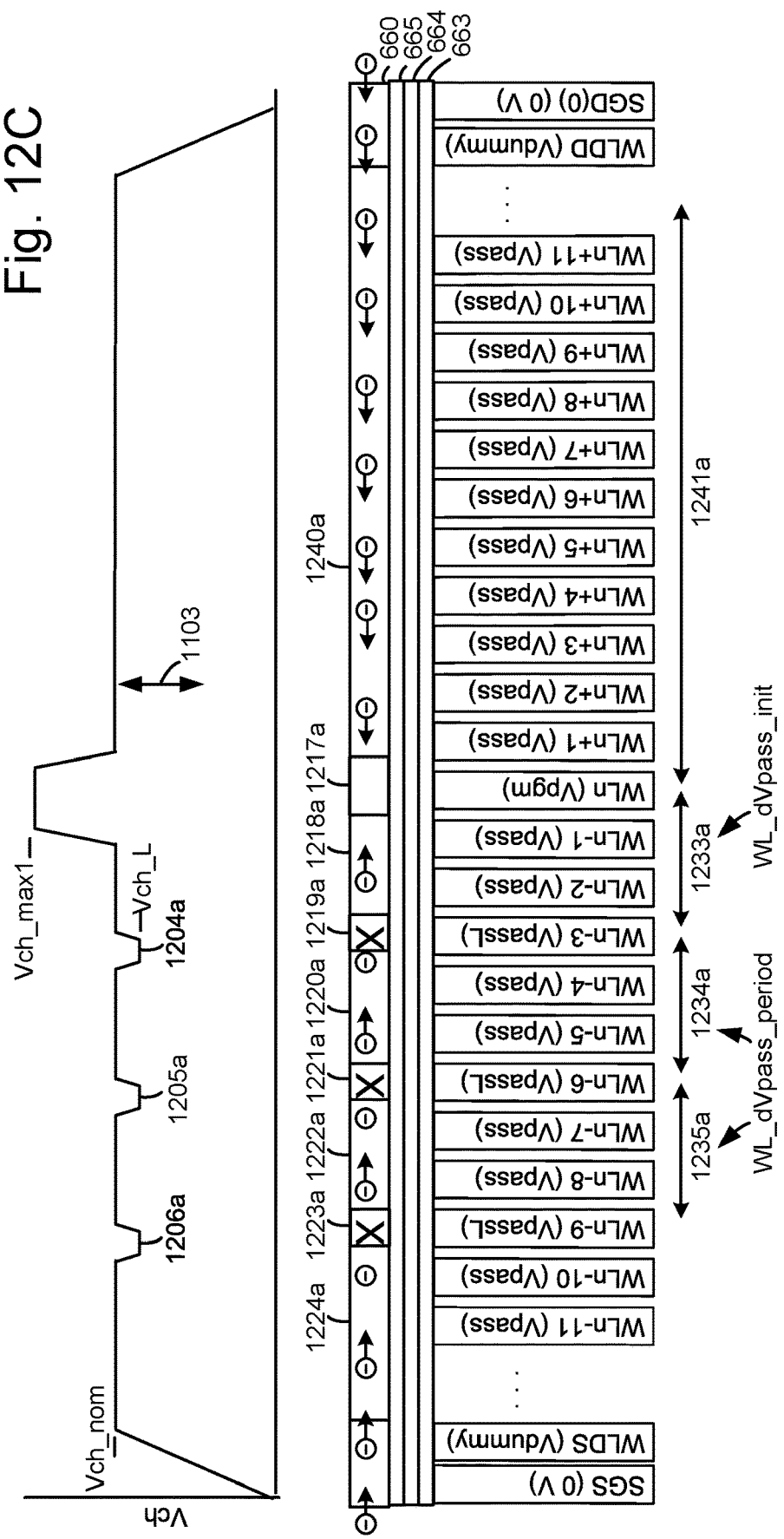
FIG. 12C depicts boosting in a channel of a NAND string when a program disturb countermeasure such as discussed in connection with FIG. 12A is used, where the countermeasure involves applying VpassL to designated word lines including WLn−3, WLn−6, WLn−9 . . . , such that WL_dVpass_init=3 and WL_dVpass_period=3.

FIG. 12C depicts boosting in a channel of a NAND string when a program disturb countermeasure such as discussed in connection with FIG. 12A is used, where the countermeasure involves applying VpassL to designated word lines including WLn−3, WLn−6, WLn−9 . . . , such that WL_dVpass_init=3 and WL_dVpass_period=3.

This approach is similar to that of FIG. 12A except that the dips in Vch are created on the source side of WLn but not on the drain side. In this example, the source side word lines are unprogrammed.

This assumes a word line program order which begins at the drain side of a NAND string and ends at the source side.

An arrow 1241a represents WLn+1 to WL95, which receive Vpass. A corresponding channel region 1240a is created in which electrons may move toward WLn. The arrow 1103 depicts an example range of Vch in the drain side channel when the associated memory cells are programmed. The arrows 1233a, 1234a and 1235a represent WL_dVpass_init, which is three word lines.

The pattern of word line voltages can extend over the entire source side of WLn in one option. For example, with word lines WL0 to WL95, and WLn=40, the word lines receiving VpassL can be: WL1, WL4, WL7, WL10, WL13, WL16, WL19, WL22, WL25, WL28, WL31, WL34 and WL37.

By applying VpassL to the designated word lines, corresponding dips are created in the channel voltage. For example, dips 1204a, 1205a and 1206a created in channel regions 1219a, 1221a and 1223a, respectively, adjacent to WLn−3, WLn−6 and WLn−9, respectively.

A nominal channel voltage is created in a channel region 1218a adjacent to WLn−1 and WLn−2, a channel region 1220a adjacent to WLn−4 and WLn−5, a channel region 1222a adjacent to WLn−7 and WLn−8, and a channel region 1224a adjacent to WL0 to WLn−10.

FIG. 13 depicts boosting in a channel of a NAND string when a program disturb countermeasure such as discussed in connection with FIG. 10A is used, where the countermeasure involves applying VpassL to designated word lines including WLn−4, WLn−7, WLn−10 . . . and WLn+4, WLn+7, WLn+10 . . . , such that WL_dVpass_init=4 and WL_dVpass_period=3. VpassL is applied to WLn−10, WLn−7, WLn−4, WLn+4, WLn+7 and WLn+10 to create dips 1301, 1302, 1303, 1304, 1305 and 1306, respectively, in Vch for channel regions 1311, 1313, 1315, 1319, 1321 and 1323, respectively. Vpass is applied to the remaining unselected word lines to create channel regions 1310, 1312, 1314, 1316, 1318, 1320, 1322 and 1324 at Vch nom.

The arrows 1332 and 1333 represent WL_dVpass_init, which is four word lines, and the arrows 1330, 1331, 1334 and 1335 represent WL_dVpass_period, which is three word lines.

In this example, the designated word lines are spaced apart at intervals which each comprise at least three word lines.

Also, among the designated word lines, a closest word line (WLn−4, WLn4) to the selected word line is N(=4) word lines away from the selected word line, and the intervals each comprise M (=3) word lines, where N≠M.

Figure 14:
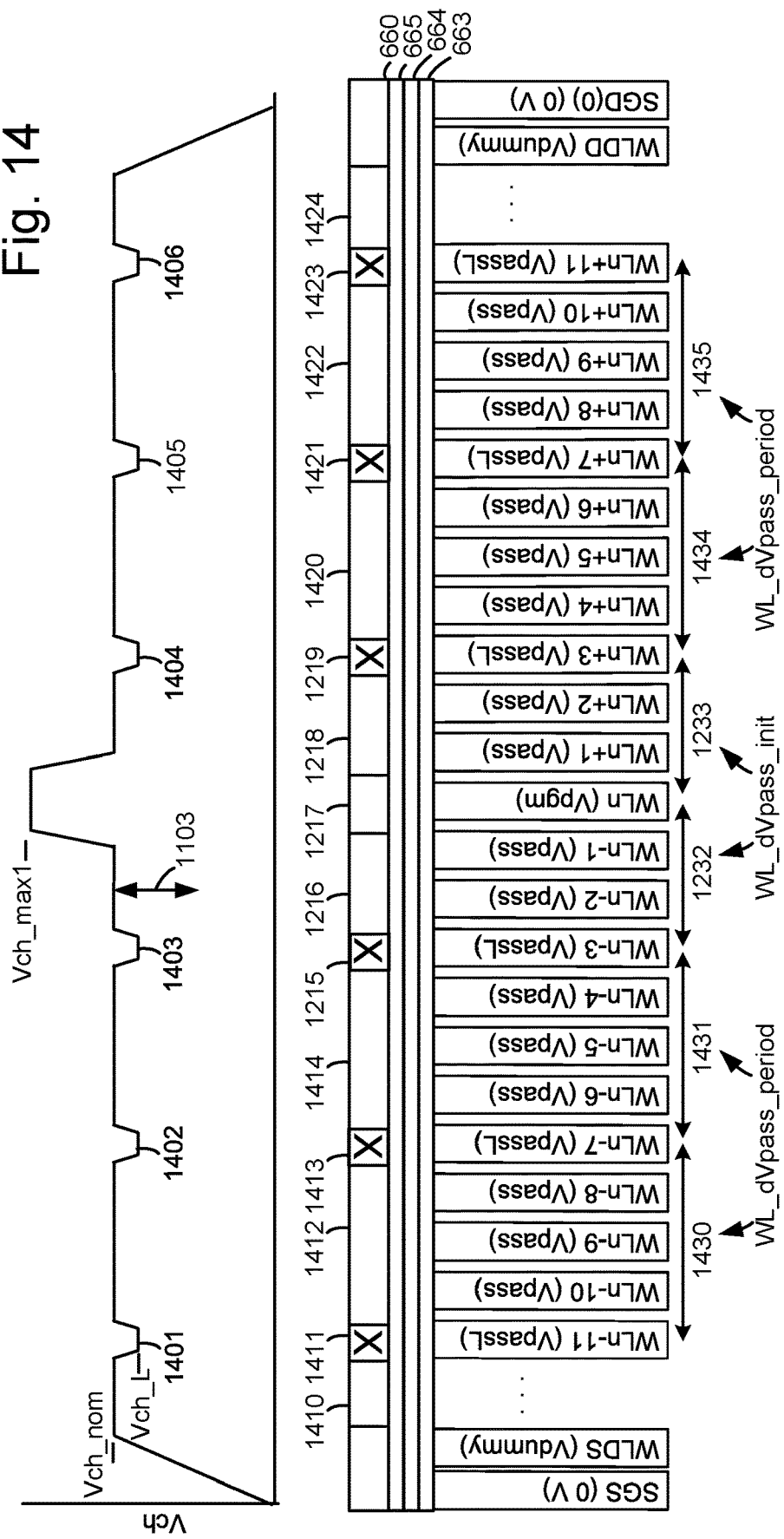
FIG. 14 depicts boosting in a channel of a NAND string when a program disturb countermeasure such as discussed in connection with FIG. 10A is used, where the countermeasure involves applying VpassL to designated word lines including WLn−3, WLn−7, WLn−11 . . . and WLn+3, WLn+7, WLn+11 . . . , such that WL_dVpass_init=3 and WL_dVpass_period=4.

The pattern of word line voltages can extend over the entire NAND string in one option. For example, with word lines WL0 to WL95, and WLn=40, the word lines receiving VpassL can be: WL0, WL3, WL6, WL9, WL12, WL15, WL18, WL21, WL24, WL27, WL30, WL33, WL36, WL44, WL47, WL50, WL53, WL56, WL59, WL62, WL65, WL68, WL71, WL74, WL77, WL80, WL83, WL86, WL89 and WL92. FIG. 14 depicts boosting in a channel of a NAND string when a program disturb countermeasure such as discussed in connection with FIG. 10A is used, where the countermeasure involves applying VpassL to designated word lines including WLn−3, WLn−7, WLn−11 . . . and WLn+3, WLn+7, WLn+11 . . . , such that WL_dVpass_init=3 and WL_dVpass_period=4. VpassL is applied to WLn−11, WLn−7, WLn−3, WLn+3, WLn+7 and WLn+11 to create dips 1401, 1402, 1403, 1404, 1405 and 1406, respectively, in Vch for channel regions 1411, 1413, 1215, 1219, 1421 and 1423, respectively. Vpass is applied to the remaining unselected word lines to create channel regions 1410, 1412, 1414, 1216, 1218, 1420, 1422 and 1424 at Vch nom.

The arrows 1232 and 1233 represent WL_dVpass_init, which is three word lines, and the arrows 1430, 1431, 1434 and 1435 represent WL_dVpass_period, which is four word lines.

The pattern of word line voltages can extend over the entire NAND string in one option. For example, with word lines WL0 to WL95, and WLn=40, the word lines receiving VpassL can be: WL1, WL5, WL9, WL13, WL17, WL21, WL25, WL29, WL33, WL37, WL43, WL47, WL51, WL55, WL59, WL63, WL67, WL71, WL75, WL79, WL83, WL87 and WL91.

FIG. 15 depicts boosting in a channel of a NAND string when a program disturb countermeasure such as discussed in connection with FIG. 10A is used, where the countermeasure involves applying VpassL to designated word lines including WLn−3, WLn−7, WLn−12 . . . and WLn+3, WLn+7, WLn+12 . . . , such that the designated word lines are spaced at progressively larger intervals along the NAND string in a direction moving away from the selected word line. This approach is based on a theory that it is more important to have a smaller interval between designated word lines closer to WLn than further from WLn, and can simplify the implementation by reducing the number of word lines which receive VpassL. VpassL is applied to WLn−12, WLn−7, WLn−3, WLn+3, WLn+7 and WLn+12 to create dips 1501, 1502, 1503, 1504, 1505 and 1506, respectively, in Vch for channel regions 1511, 1513, 1515, 1519, 1521 and 1523, respectively. Vpass is applied to the remaining unselected word lines to create channel regions 1510, 1512, 1514, 1516, 1518, 1520, 1522 and 1524 at a higher voltage of Vch nom.

The arrows 1532 and 1533 represent WL_dVpass_init=3, the arrows 1531 and 1534 represent WL_dVpass_period=4, and the arrows 1530 and 1535 represent WL_dVpass_period=5. The designated word lines are therefore spaced at progressively larger intervals of 3, 4, 5, . . . word lines away from WLn on both the source and drain sides of WLn.

In another option, the designated word lines are spaced at progressively larger intervals along the NAND string in a direction moving away from the selected word line, on the drain or source side, but not both the drain and source sides.

The pattern of word line voltages can extend over the entire NAND string in one option. For example, with word lines WL0 to WL95, and WLn=40, the word lines receiving VpassL can be: WL7, WL15, WL22, WL28, WL33, WL37, WL43, WL47, WL52, WL58, WL65, WL73, WL82 and WL92.

FIG. 16 depicts boosting in a channel of a NAND string when a program disturb countermeasure such as discussed in connection with FIG. 10A is used, where the countermeasure involves applying VpassL−, VpassL and VpassL+ to designated word lines including WLn−2, WLn−5, WLn−9, respectively, and to WLn+2, WLn+5, WLn+9, respectively, such that the reduced pass voltage for the designated word lines is progressively higher for designated word lines which are progressively further from the selected word line. VpassL−, VpassL and VpassL+(where VpassL−<VpassL<VpassL+) refer to example pass voltages which are less than Vpass. Three example reduced pass voltages (−Vpass) are depicted, but there could be two or more.

VpassL+ is applied to WLn−9 and WLn+9 to create dips 1601 and 1606, respectively, in Vch for channel regions 1511 and 1523, respectively. VpassL is applied to WLn−5 and WLn+5 to create dips 1502 and 1505, respectively, in Vch for channel regions 1513 and 1521, respectively. VpassL− is applied to WLn−2 and WLn+2 to create dips 1603 and 1604, respectively, in Vch for channel regions 1515 and 1519, respectively.

Vpass is applied to the remaining unselected word lines to create channel regions 1510, 1512, 1514, 1516, 1518, 1520, 1522 and 1524 at Vch nom.

The arrows 1532 and 1533 represent WL_dVpass_init, which is two word lines, the arrows 1531 and 1534 represent WL_dVpass_period=three word lines, and the arrows 1530 and 1535 represent WL_dVpass_period=four word lines.

The pattern of word line voltages can extend over the entire NAND string in one option. For example, with word lines WL0 to WL95, and WLn=40, the word lines receiving VpassL can be: WL7, WL15, WL22, WL28, WL33, WL37, WL43, WL47, WL52, WL58, WL65, WL73, WL82 and WL92.

A control circuit can be configured with parameters such as dVpass, WL_dVpass_init and WL_dVpass_period to implement the periodic word line bias technique described herein. See also the parameter tables of FIG. 22B to 22D. These parameters can be optimized based on testing. Generally, if dVpass is too high (VpassL is too low), gate induced drain leakage can occur which generates many electron-hole pairs in the channel, resulting in a greater likelihood of pulling down the peak Vch at WLn. If dVpass is too low (VpassL is too high), the potential barrier created by the periodic dips in Vch may not be great enough to inhibit electron movement in the channel. See also FIG. 18. If WL_dVpass_init is too low, such as one or two words lines, the initial designated word line may be too close to WLn such that the Vch at WLn is pulled down. See also FIG. 19. If WL_dVpass_period is too low, the number of designated word lines receiving VpassL will be too great such that the overall Vch can be pulled down. See also FIG. 20.

In FIG. 17A to 17D, the WL programming order is from the source side to the drain side of the block. Additionally, the lower word line is WL0 or is within a few word lines of the source end of the block, the lower-middle WL is about 25% of the way between the source end and the drain end, the upper-middle WL is about 75% of the way between the source end and the drain end, and the upper WL is at the drain end of the block or is within a few word lines of the drain end of the block. Also, the data is based on a block which includes an interface between a top half of the block and a bottom half of the block. The time range depicted corresponds to FIG. 10A and includes a pre-charge phase and a program/boosting phase. Also, dVpass=0.8 V, WL_dVpass_init=4 word lines, and WL_dVpass_init=4 word lines.

Figure 17A:
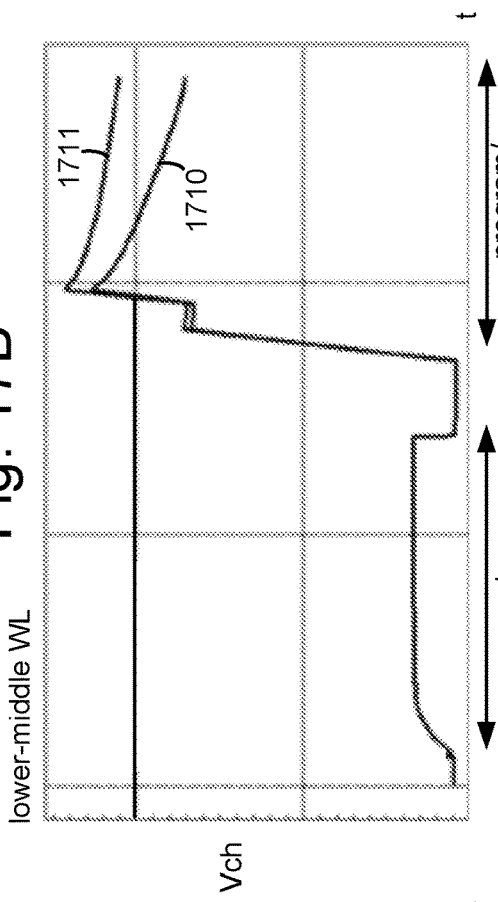
FIG. 17A depicts plots of channel voltage versus time, consistent with the voltage signals of FIG. 10A, when WLn is a lower WL.

FIG. 17A depicts plots of channel voltage versus time, consistent with the voltage signals of FIG. 10A, when WLn is a lower WL. The plots 1700 and 1701 depict Vch without and with, respectively, the program disturb countermeasure. The peak Vch is increased significantly when the program disturb countermeasure is used.

Figure 17B:
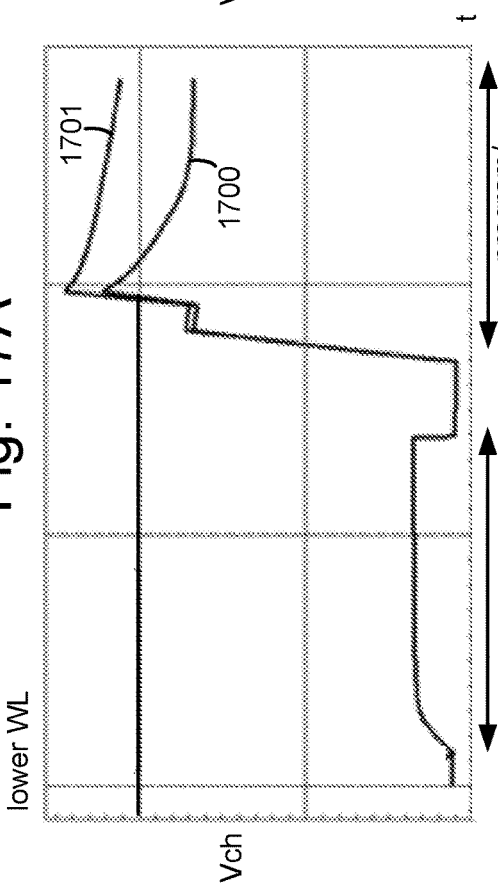
FIG. 17B depicts plots of channel voltage versus time, consistent with the voltage signals of FIG. 10A, when WLn is a lower-middle WL.

FIG. 17B depicts plots of channel voltage versus time, consistent with the voltage signals of FIG. 10A, when WLn is a lower-middle WL. The plots 1710 and 1711 depict Vch without and with, respectively, the program disturb countermeasure. As before, the peak Vch is increased significantly when the program disturb countermeasure is used.

Figure 17C:
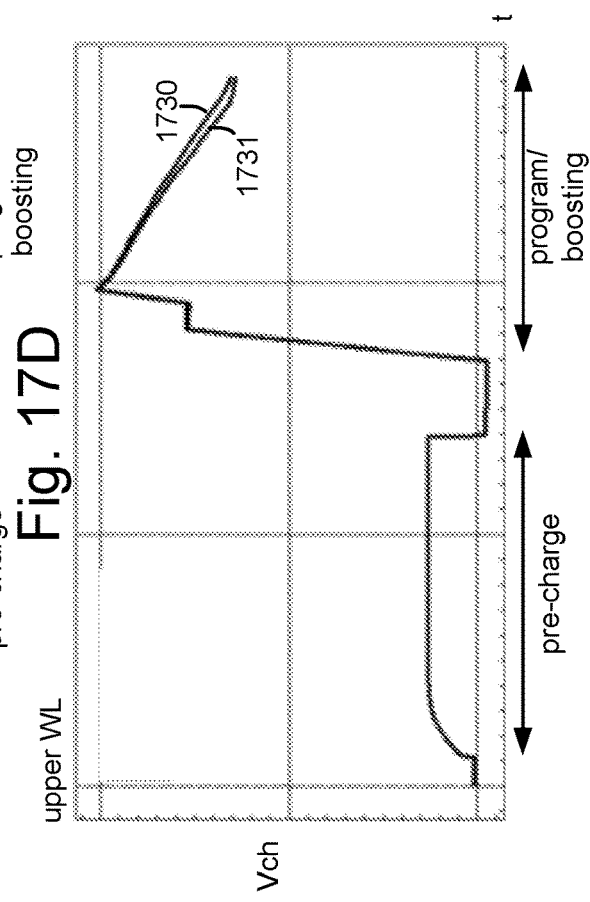
FIG. 17C depicts plots of channel voltage versus time, consistent with the voltage signals of FIG. 10A, when WLn is an upper-middle WL.

FIG. 17C depicts plots of channel voltage versus time, consistent with the voltage signals of FIG. 10A, when WLn is an upper-middle WL. The plots 1720 and 1721 depict Vch without and with, respectively, the program disturb countermeasure. As before, the peak Vch is increased significantly when the program disturb countermeasure is used.

Figure 17D:
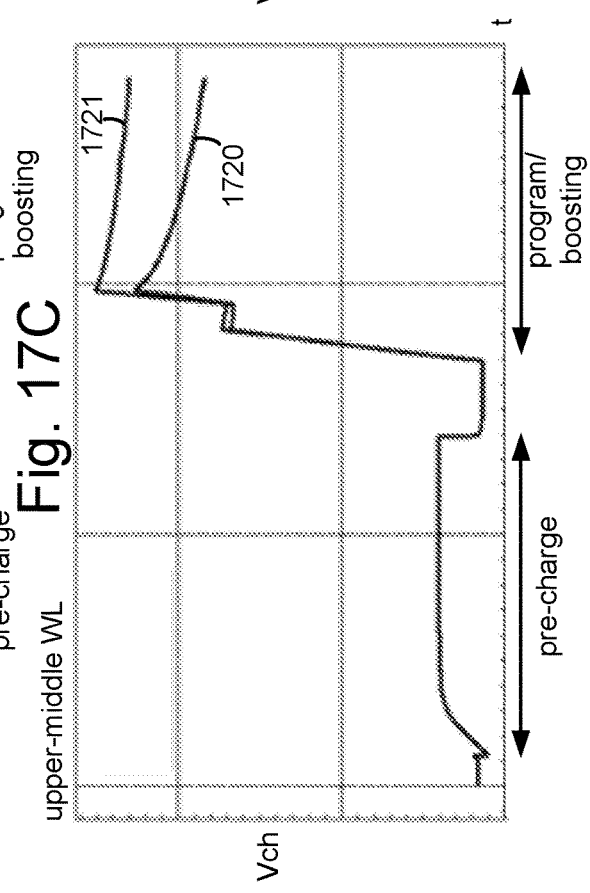
FIG. 17D depicts plots of channel voltage versus time, consistent with the voltage signals of FIG. 10A, when WLn is an upper WL.

FIG. 17D depicts plots of channel voltage versus time, consistent with the voltage signals of FIG. 10A, when WLn is an upper WL. The plots 1730 and 1731 depict Vch without and with, respectively, the program disturb countermeasure. In this case, the peak Vch is not increased when the program disturb countermeasure is used. This indicates the countermeasure is not advantageous when WLn is relatively close to the drain end of the NAND string, e.g., within a subset of word lines adjacent to the drain end, where the subset comprises no more than 5-10% of the set of word lines connected to the NAND string.

Figure 21A:
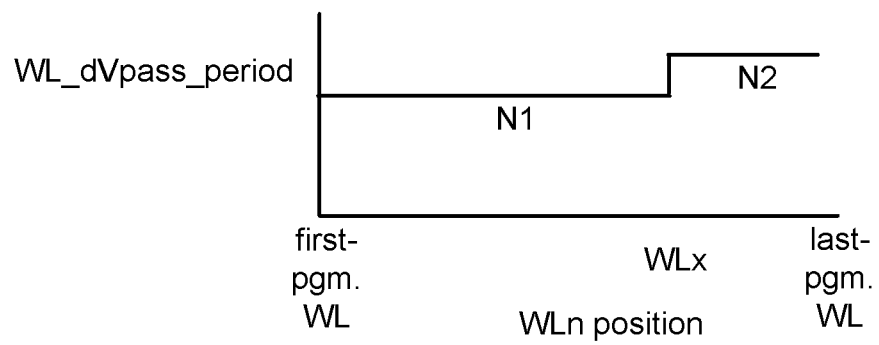
FIG. 21A depicts a plot of WL_dVpass_period versus the WLn position.
Figure 21B:
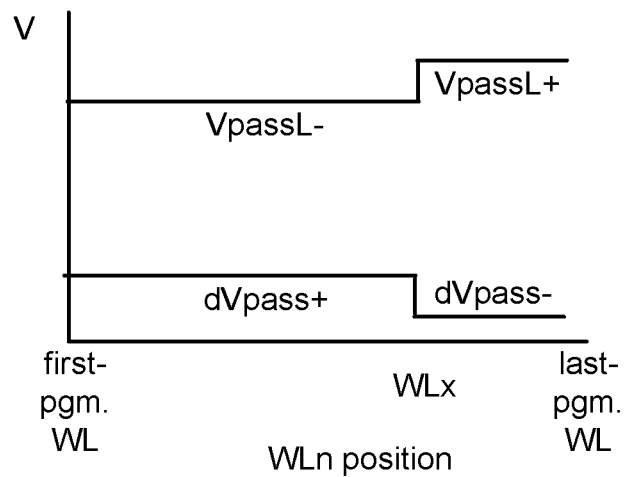
FIG. 21B depicts a plot of VpassL and dVpass versus the WLn position.
Figure 21C:
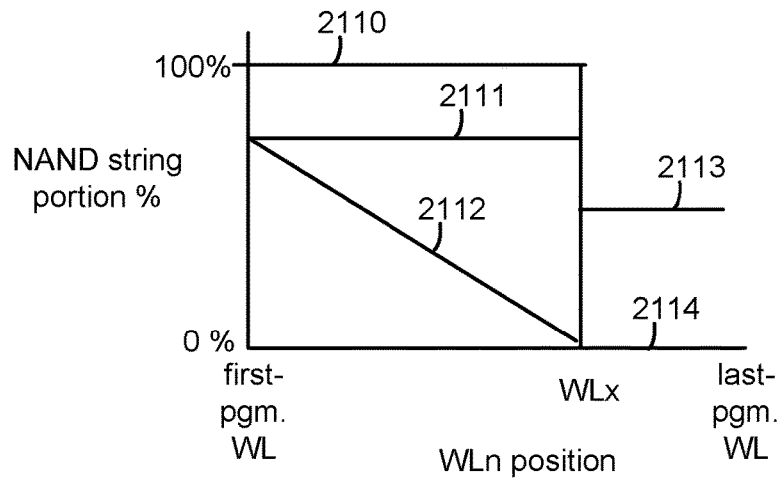
FIG. 21C depicts a plot of a portion of a NAND string which is subject to a program disturb countermeasure versus the WLn position.

FIG. 21A to 21C show example implementations of the program disturb countermeasures described herein based on the knowledge of FIG. 17A to 17D. In one approach, the program disturb countermeasures can be phased out or not used for WLn positions which are close to the drain end of the NAND string. In another approach, a portion of the NAND string which is subject to the program disturb countermeasures is a function of WLn.t FIG. 18 depicts plots of channel voltage versus time, consistent with the voltage signals of FIG. 10A, for different values of dVpass. The plots include "nom." representing the nominal or comparison case in which the program disturb countermeasure is not used. The peak Vch is lowest for this case. The next higher peak Vch corresponds to dVpass=0.4 V. The next higher peak Vch corresponds to dVpass=0.8 V. The highest peak Vch corresponds to dVpass=1.2-2.0 V. The data is based on WLn=40, WL_dVpass_init=4 word lines, and WL_dVpass_init=4 word lines. The boosting potential increases as dVpass increases but saturates as dVpass reaches 1.2 V such that the blocking of electron movement in the channel is not improved. dVpass is set such that VpassL is a positive voltage. In one implementation, the voltage (VpassL) applied to the word lines adjacent to the channel regions with the periodic dips is a positive voltage and is no more than 2 V lower than the voltage (Vpass) applied to word lines adjacent to remaining regions of the channel.

FIG. 19 depicts plots of channel voltage versus time, consistent with the voltage signals of FIG. 10A, for different values of WL_dVpass_init, the number of word lines between WLn and the closest word line receiving VpassL. WLn=90 out of 160 word lines in this example. The plots include "40 WL or nom." representing the case with WL_dVpass_init=40 or where the program disturb countermeasure is not used. The peak Vch is lowest for this case. The next higher peak Vch corresponds to WL_dVpass_init=15 word lines. The next higher peak Vch corresponds to WL_dVpass_init=2 word lines. The highest peak Vch corresponds to WL_dVpass_init=3-5 word lines. WL_dVpass_init=2 word lines may be smaller than optimum. The boosting level increases as WL_dVpass_init increases until WL_dVpass_init reaches 3-5 word lines. The boosting level then decreases as WL_dVpass_init increases further.

FIG. 20 depicts plots of channel voltage versus time, consistent with the voltage signals of FIG. 10A, for different values of WL_dVpass_period, the interval between word lines receiving VpassL. In this example, there are 160 word lines, WLn=40, dVpass=0.8 V and WL_dVpass_init=4 in this example. The plots include "nom." representing the nominal case in which the program disturb countermeasure is not used. The peak Vch is lowest for this case. The next higher peak Vch corresponds to WL_dVpass_period=3 word lines. The next higher peak Vch corresponds to WL_dVpass_period=5 word lines. The next higher peak Vch corresponds to WL_dVpass_period=8 word lines. The highest peak Vch corresponds to WL_dVpass_period=20 word lines, although it is roughly the same for 5, 8 and 20 word lines. The boosting potential increases with a larger period and is almost saturated when the period exceeds 8 word lines. This indicates that having fewer word lines biased at VpassL can be beneficial in optimizing the peak Vch. Although, having a smaller period, and therefore applying VpassL to more word lines, can reduce Vpass disturb, in which Vpass is high enough to disturb a memory cell connected to an unselected word line.

FIG. 21A depicts a plot of WL_dVpass_period versus the WLn position. The WLn position refers to the position of WLn among a plurality of word lines of a block which are connected to NAND strings in the blocks. The WL position extends from a first programmed WL to a last-programmed WL.

FIG. 17A to 17D showed that the program disturb countermeasure may lose its effectiveness when WLn is at the drain side of a NAND string. Accordingly, one approach is to set the parameters of the program disturb countermeasure based on the position of the selected word line, WLn, among a plurality of word lines of a block, and based on the WL programming order.

In this case, WL_dVpass_period is a number N1 when WLn is between the first-programmed word line and a transition word line WLx, and a number N2>N1 when WLn is at or between WLx and the last-programmed word line. WLx can be within a subset of word lines adjacent to the last-programmed word line, where the subset comprises no more than 5-10% of the set of word lines connected to the NAND string. For example, with 96 word lines, and assuming a source-to-drain programming order, WLx can be WL85-WL90. Increasing WL_dVpass_period reduces the number of word lines which receive VpassL to minimize the reduction of the overall Vch when VpassL is used as seen in FIG. 10B.

In this example, the intervals or periods are an increasing function of a distance of the selected word line from the first-programmed WL.

FIG. 21B depicts a plot of VpassL and dVpass versus the WLn position. Since the program disturb countermeasure is less effective when WLn is closer to the last-programmed word line, VpassL can be increased (and dVpass can be decreased) when WLn is closer to the last-programmed word line. Thus, VpassL and dVpass can be set based on the position of WLn. In this case, VpassL=VpassL− when WLn is between the first-programmed WL and a transition word line WLx, and VpassL=VpassL+ when WLn is at or between WLx and the last-programmed word line, where VpassL−<VpassL+.

In this example, the pass voltage for the designated word lines is an increasing function of a distance of the selected word line from the first-programmed WL.

Alternatively, the nominal technique can be used when WLn is close to the last-programmed WL.

FIG. 21C depicts a plot of a portion of a NAND string which is subject to a program disturb countermeasure versus the WLn position. As mentioned, the program disturb countermeasure can be phased out as the WLn position becomes closer to the last-programmed WL. In one approach, a portion of a NAND string on the drain side of WLn (and adjacent to WLn) which is subject to the program disturb countermeasure is a function of the WLn position. For example, the portion of the NAND string on the drain side of WLn which is subject to the program disturb countermeasure can be a decreasing function of distance between WLn and the first-programmed WL. That is, the portion becomes smaller as the distance becomes smaller. Various options are possible.

In one approach, the portion is 100% (plot 2110) when WLn<WLx and 0% (plot 2114) when WLn≥WLx, or a non-zero portion such as 50% (plot 2113) when WLn≥WLx. In another approach, the portion is less than 100%, such as 75% (plot 2111) when WLn<WLx. In another option, the portion gradually decreases (plot 2112) as WLn moves closer to the drain end.

The program disturb countermeasure can create periodic dips in a portion of the unselected NAND string on one side of the unselected NAND string, for example, where the portion is a decreasing function of distance between the selected word line and the first-programmed WL.

Figure 21D:
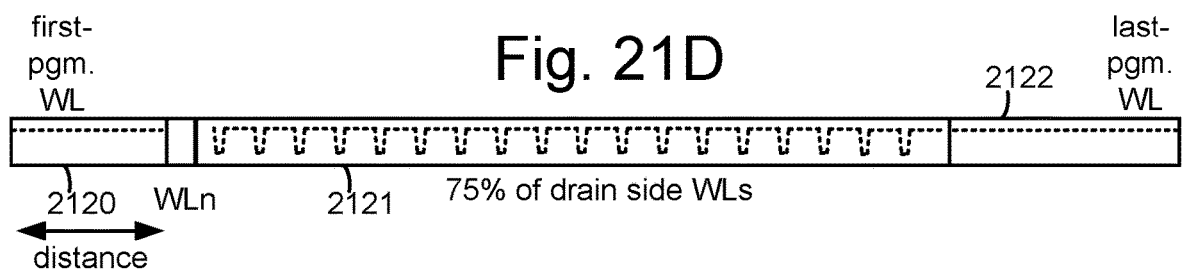
FIG. 21D depicts a NAND string channel in which 75% of the drain side word lines are subject to a program disturb countermeasure.
Figure 21E:
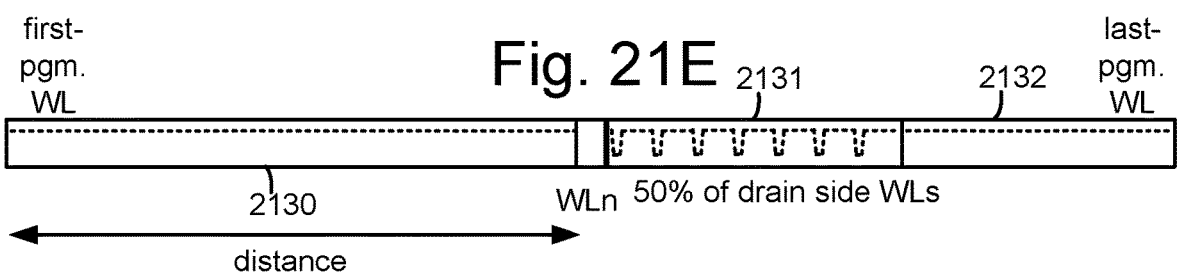
FIG. 21E depicts a NAND string channel in which 50% of the drain side word lines are subject to a program disturb countermeasure.
Figure 21F:
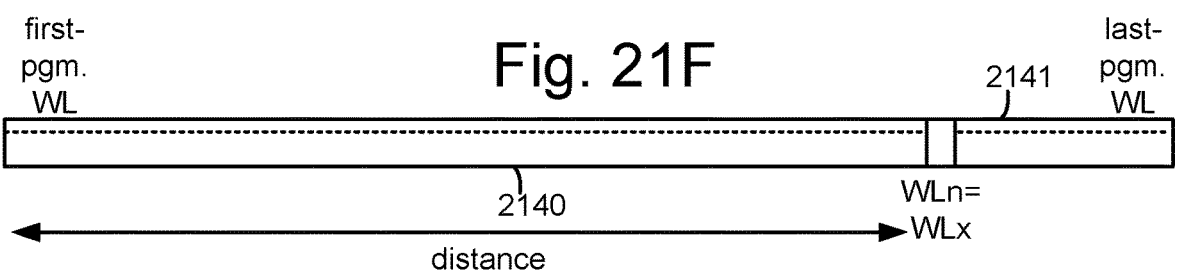
FIG. 21F depicts a NAND string channel in which 0% of the drain side word lines are subject to a program disturb countermeasure.

FIG. 21D to 21F depict different portions of a NAND string which are subject to a program disturb countermeasure as a function of different WLn positions, consistent with FIG. 21C. For the portion of the NAND string which is subject to a program disturb countermeasure, periodic dips, as discussed previously, are created in a corresponding channel region. In these examples, the WL programming order is from the source side to the drain side. "Distance" denotes the distance, e.g., in terms of a number of word lines or a physical distance, between WLn and the first-programmed WL.

FIG. 21D depicts a NAND string channel in which 75% of the drain side word lines are subject to a program disturb countermeasure. The NAND string channel includes a source side region 2120 of WLn which may not be subject to a program disturb countermeasure, a drain side region 2121 of WLn, comprising 75% of all drain side word lines, which is subject to a program disturb countermeasure, and a drain side region 2122 of WLn, comprising 25% of all drain side word lines, which is not subject to a program disturb countermeasure. The dashed line denotes the channel voltage in the different regions. The periodic dips in the channel voltage are in the region 2121 but not the regions 2120 and 2122. Instead, a fixed channel voltage may exist in the regions 2120 and 2122.

FIG. 21E depicts a NAND string channel in which 50% of the drain side word lines are subject to a program disturb countermeasure. The NAND string channel includes a source side region 2130 of WLn which is not be subject to a program disturb countermeasure, an adjacent drain side region 2131 of WLn, comprising 50% of all drain side word lines, which is subject to a program disturb countermeasure, and a non-adjacent drain side region 2132 of WLn, comprising 50% of all drain side word lines, which is not subject to a program disturb countermeasure. The dashed line denotes the channel voltage in the different regions. The periodic dips in the channel voltage are in the region 2131 but not the regions 2130 and 2132. Instead, a fixed channel voltage may exist in the regions 2130 and 2132.

FIG. 21F depicts a NAND string channel in which 0% of the drain side word lines are subject to a program disturb countermeasure. The NAND string channel includes a source side region 2140 and a drain side region 2141 of WLn which are not be subject to a program disturb countermeasure. The dashed line denotes the channel voltage in the different regions. The periodic dips are not present. Instead, a fixed channel voltage may exist in the regions 2140 and 2141.

Figures 22A, 22B, 22C, 22D:
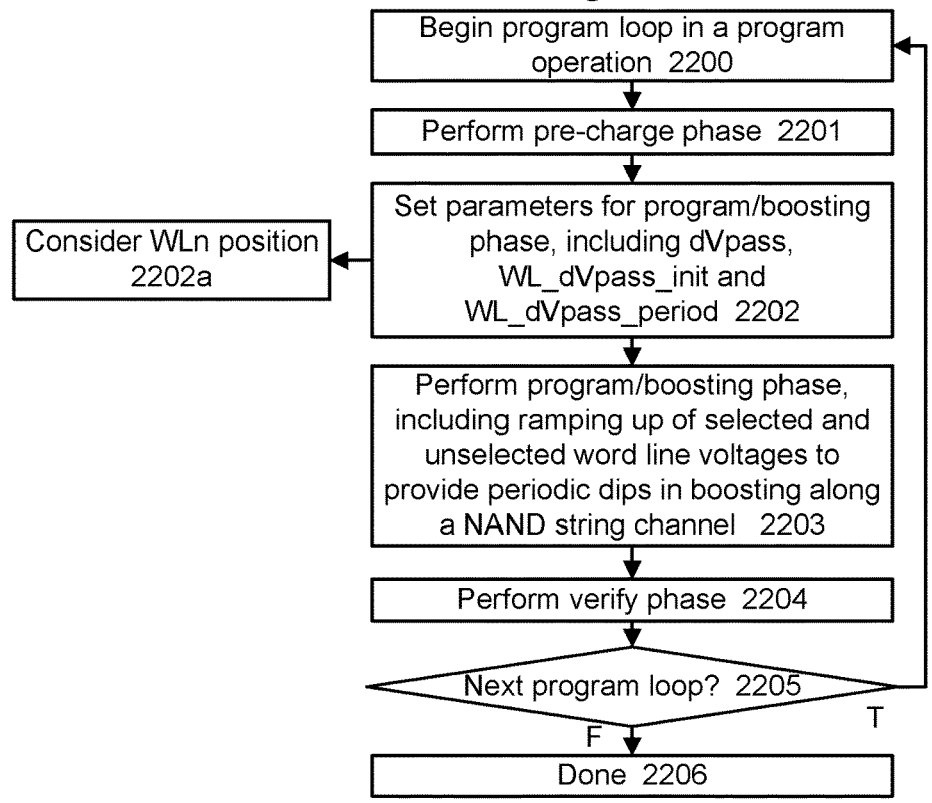
FIG. 22A depicts a process for programming a block.
FIG. 22B depicts a table of values of dVpass for use in step 2202 of FIG. 22A.
FIG. 22C depicts a table of values of WL_dVpass_init for use in step 2202 of FIG. 22A.
FIG. 22D depicts a table of values of WL_dVpass_period for use in step 2202 of FIG. 22A.

FIG. 22A depicts a process for programming a block. Step 2200 begins a program loop in a program operation. The program operation can result in different Vth levels for the memory cells, such as depicted in FIG. 8. Step 2201 includes performing a pre-charge phase. Step 2202 includes setting parameters for a program/boosting phase, including dVpass, WL_dVpass_init and WL_dVpass_period. Step 2202*a* includes considering the WLn position. As discussed, these parameters can be optimized based on factors such as WLn position. See also FIG. 22B to 22D which show tables of parameters which are cross-referenced to code words for access by a control circuit. For example, the parameters can also be optimized on a block or chip level. Step 2203 includes performing the program/boosting phase, including ramping up voltages of selected and unselected word lines to provide periodic dips in boosting along a NAND string channel, as discussed. Step 2204 includes performing a verify phase. A decision step 2205 determines if a next program loop is to be performed. If the decision step 2205 is true, step 2200 is reached again. If the decision step 2205 is false, the program operation is done at step 2206. Example details of voltage signals in the pre-charge phase 2307, program/boosting phase 2308 and verify phase 2309 are provided in FIG. 23.

FIG. 22B depicts a table of values of dVpass for use in step 2202 of FIG. 22A. A control circuit can use a 3-bit code word to access one of eight different values. For example, the code words 000, 001, 010, 011, 100, 101, 110 and 111 correspond to dVpass=0.6, 0.8, 1.0, 1.2, 1.4, 1.6, 1.8 and 2.0 V, respectively.

FIG. 22C depicts a table of values of WL_dVpass_init for use in step 2202 of FIG. 22A. As before, a control circuit can use a 3-bit code word to access one of eight different values. For example, the code words 000, 001, 010, 011, 100, 101, 110 and 111 correspond to WL_dVpass_init=3, 4, 5, 6, 7, 8, 9 and 10 word lines, respectively.

FIG. 22D depicts a table of values of WL_dVpass_period for use in step 2202 of FIG. 22A. As before, a control circuit can use a 3-bit code word to access one of eight different values. For example, the code words 000, 001, 010, 011, 100, 101, 110 and 111 correspond to WL_dVpass_period=3, 4, 5, 6, 7, 8, 9 and 10 word lines, respectively.

FIG. 23 depicts example voltage signals for performing a program operation, consistent with FIG. 22. The vertical dimension denotes voltage and the horizontal dimension denotes time, with time points t0-t12. The voltages depicted are examples. The period of time depicted corresponds to one program loop and includes a pre-charge phase 2307 (t0-t2), a program/boosting phase 2308 (t2-t8) and a verify phase 2309 (t9-t12). Voltage signals 2300, 2310, 2320, 2330, 2340 and 2350 depict VWLn (the voltage of the selected word line), VWL_unsel (the voltage of the unselected word lines), Vsgd (the voltage of the SGD transistors), Vsgs (the voltage of the SGS transistors), Vbl (the bit line voltage) and Vsl (the source line voltage), respectively.

The pre-charge phase is used to charge up the channels of the NAND string. In the pre-charge phase, plot 2301 depicts a positive voltage such as 1-2 V for VWLn. In the program/boosting phase, VWLn is increased from 0 V (plot 2302) to a pass voltage, Vpass (plot 2304), at t3 and then to a peak level, Vpgm (plot 2305), at t5. VWLn is then decreased back to 0 V at t6 before the verify phase 2309. In the verify phase, a verify signal 2306 is applied to the selected word line, and the selected memory cells are sensed during the different verify voltages of the verify signal. In this example, the verify voltages are VvE, VvF and VvG.

For VWL_unsel, plot 2311 depicts a positive voltage such as 1-2 V in the pre-charge phase. In the program/boosting phase, VWL_unsel is increased from 0 V (plot 2312) to Vpass (plot 2314) or VpassL (plot 2315) and maintained at that level during the application of Vpgm. As mentioned, VpassL is applied to designated word lines and Vpass is applied to remaining word lines between the designated word lines. VWL_unsel is set to Vread, which may equal Vpass, during the verify phase 2309.

For Vsgd, plot 2321 depicts a positive voltage such as 4-6 V for all SGD transistors in a block. This allows Vbl to be passed to the channels. For SGD transistors of a selected sub-block, plot 2322 depicts Vsgd_sel, e.g., 2.5 V during the program/boosting phase. Vsgd_sel is high enough to provide the associated SGD transistors in a conductive state for the selected NAND strings, which receive a program-enable voltage of Vbl en=0 V. For SGD transistors of unselected sub-blocks, plot 2323 depicts Vsgd_unsel, e.g., 0 V during the program/boosting phase. This provides the associated SGD transistors in a non-conductive state for the unselected NAND strings which receive a program-inhibit voltage of Vbl_inh. This allows the associated channels to be boosted by capacitive coupling when VWLn and VWL_unsel are ramped up from 0 V to Vpass or VpassL. This is in addition to the boosting from the pre-charge phase. A plot 2324 shows Vsgd_sel at an elevated level such as 4-6 V during the verify phase to allow sensing to occur in the associated NAND strings. A plot 2325 shows Vsgd_unsel at 0 V during the verify phase since sensing does not occur in the associated NAND strings.

For Vsgs, in one approach, all SGS transistors in a block are connected and receive the same voltage. In the pre-charge phase, plot 2331 depicts a positive voltage such as 4-6 V for all SGS transistors in a block. This allows a voltage to be passed to the channels from the substrate.

Plot 2334 depicts Vsgs=0 V during the program/boosting phase. A plot 2335 shows Vsgd at an elevated level such as 4-6 V during the verify phase to allow sensing to occur in the selected NAND strings.

Vbl represents the bit line voltage, which can be set separately for selected and unselected NAND strings. In the pre-charge phase, plot 2341 depicts a positive pre-charge voltage, Vbl_pc, such as 2 V for selected NAND strings. Plot 2343 depicts 0 V for bit lines connected to unselected NAND strings. In the program/boosting phase, a plot 2342 depicts a program-inhibit voltage Vbl_inh=1.5 V, for example, for the unselected NAND strings, and a plot 2343 depicts a program-enable voltage Vbl_en=0 V, for example, for the selected NAND strings. A plot 2344 shows Vbl=0.5 V, for example, during the verify phase.

For Vsl, in the pre-charge phase in a first time period from t0-t1, plot 2351 depicts a positive pre-charge voltage such as 2 V. In the program/boosting phase, a plot 2354 depicts Vsl at a positive voltage to help maintain the SGS transistors in a non-conductive state. Vsl may be a small positive voltage during the verify phase, as depicted by plot 2355.

Accordingly, it can be seen that in one implementation, an apparatus comprises: a control circuit configured to connect to a plurality of word lines, the plurality of word lines are connected to memory cells in a NAND string and comprise a selected word line and unselected word lines, and the NAND string comprises a channel; and a memory interface connected to the control circuit. The control circuit is configured to issue a command via the memory interface to apply a plurality of voltage signals to the plurality of word lines to boost a voltage of the channel, the plurality of voltage signals comprise a program voltage signal applied to the selected word line, and voltage signals which increase from a respective initial voltage to a pass voltage, wherein among the unselected word lines, the pass voltage is lower for designated word lines spaced at intervals along the NAND string than for word lines between the designated word lines.

In another implementation, a method comprises: applying a program voltage signal to a selected word line in a program operation, the selected word line and unselected word lines are among a plurality of word lines connected to a selected NAND string and an unselected NAND string, and the unselected NAND string comprises a channel; and during the applying of the program voltage signal, applying voltage signals to the unselected word lines, the voltage signals applied to the unselected word lines increase from respective initial voltages to respective pass voltages, creating periodic dips in boosting in the channel.

In another implementation, an apparatus comprises: a NAND string comprising a plurality of memory cells and a channel; and a plurality of word lines connected to the memory cells, each word line is adjacent to a respective region of the channel and is configured to carry a voltage signal which boosts a voltage of the respective region of the channel, the channel having a voltage with periodic dips along a length of the NAND string.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a plurality of word lines, the plurality of word lines are connected to memory cells in a NAND string and comprise a selected word line and unselected word lines, and the NAND string comprises a channel; and
a memory interface connected to the control circuit, the control circuit is configured to issue a command via the memory interface to apply a plurality of voltage signals to the plurality of word lines to boost a voltage of the channel, the plurality of voltage signals comprise a program voltage signal applied to the selected word line, and voltage signals which increase from a respective initial voltage to a pass voltage, wherein among the unselected word lines, the pass voltage is lower for designated word lines spaced at intervals along the NAND string than for word lines between the designated word lines.

2. The apparatus of claim 1, wherein:
the designated word lines are spaced at equal intervals along the NAND string; and
the equal intervals each comprise at least three word lines.

3. The apparatus of claim 1, wherein:
among the designated word lines, a closest word line to the selected word line is N word lines away from the selected word line, and the intervals each comprise M word lines, where N≠M.

4. The apparatus of claim 1, wherein:
among the designated word lines, a closest word line to the selected word line is N word lines away from the selected word line, and the intervals each comprise N word lines.

5. The apparatus of claim 1, wherein:
the designated word lines comprise unprogrammed word lines.

6. The apparatus of claim 1, wherein:
the intervals are an increasing function of a distance of the selected word line from a first-programmed word line of the plurality of word lines.

7. The apparatus of claim 1, wherein:
the pass voltage for the designated word lines is an increasing function of a distance of the selected word line from a first-programmed word line of the plurality of word lines.

8. The apparatus of claim 1, wherein:
the pass voltage applied to the word lines between the designated word lines is no more than 2 V higher than the pass voltage applied to the designated word lines.

9. The apparatus of claim 1, wherein:
the designated word lines are spaced at progressively larger intervals along the NAND string in a direction moving away from the selected word line.

10. The apparatus of claim 1, wherein:
the pass voltage for the designated word lines is progressively higher for designated word lines which are progressively further from the selected word line.

11. A method, comprising:
applying a program voltage signal to a selected word line in a program operation, the selected word line and unselected word lines are among a plurality of word lines connected to a selected NAND string and an unselected NAND string, and the unselected NAND string comprises a channel; and
during the applying of the program voltage signal, applying voltage signals to the unselected word lines, the voltage signals applied to the unselected word lines increase from respective initial voltages to respective pass voltages, creating periodic dips in boosting in the channel.

12. The method of claim 11, wherein:
the periodic dips are adjacent to unselected word lines spaced apart along the unselected NAND string; and
the unselected word lines adjacent to the periodic dips are spaced apart from one another by at least two intervening word lines.

13. The method of claim 11, wherein:
the periodic dips are created in a portion of the unselected NAND string which is unprogrammed.

14. The method of claim 13, wherein:
the portion is a decreasing function of distance between the selected word line and a first programmed word line of the plurality of word lines.

15. The method of claim 13, wherein:
the portion is on a drain side of the selected word line.

16. An apparatus, comprising:
a NAND string comprising a plurality of memory cells and a channel; and
a plurality of word lines connected to the memory cells, each word line is adjacent to a respective region of the channel and is configured to carry a voltage signal which boosts a voltage of the respective region of the channel, the channel having a voltage with periodic dips along a length of the NAND string.

17. The apparatus of claim 16, wherein:
the periodic dips occur over majority of the length of the NAND string.

18. The apparatus of claim 16, wherein:
a voltage of word lines adjacent to regions of the channel having the periodic dips is a positive voltage and is no more than 2 V lower than a voltage of word lines adjacent to remaining regions of the channel.

19. The apparatus of claim 16, wherein:
the periodic dips occur in respective regions of the channel which are adjacent to unselected word lines of the plurality of word lines while a program voltage is applied to a selected word line of the plurality of word lines.

20. The apparatus of claim 19, wherein:
a voltage of word lines adjacent to regions of the channel having the periodic dips is a function of a position of the selected word line among the plurality of word lines.

* * * * *